US011626432B2

(12) United States Patent
Otake et al.

(10) Patent No.: US 11,626,432 B2
(45) Date of Patent: *Apr. 11, 2023

(54) SOLID STATE IMAGE SENSOR AND ELECTRONIC DEVICE

(71) Applicant: SONY SEMICONDUCTOR SOLUTIONS CORPORATION, Kanagawa (JP)

(72) Inventors: Yusuke Otake, Kanagawa (JP); Toshifumi Wakano, Kanagawa (JP); Takuya Sano, Tokyo (JP); Yusuke Tanaka, Kanagawa (JP); Keiji Tatani, Kanagawa (JP); Hideo Harifuchi, Yamagata (JP); Eiichi Tauchi, Yamagata (JP); Hiroki Iwashita, Nagasaki (JP); Akira Matsumoto, Nagasaki (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/502,576

(22) Filed: Jul. 3, 2019

(65) Prior Publication Data
US 2019/0326338 A1 Oct. 24, 2019

Related U.S. Application Data

(63) Continuation of application No. 15/502,821, filed as application No. PCT/JP2015/072321 on Aug. 6, 2015, now Pat. No. 10,347,673.

(30) Foreign Application Priority Data

Aug. 19, 2014 (JP) .............................. JP2014-166561

(51) Int. Cl.
H01L 27/146 (2006.01)
H01L 29/10 (2006.01)
H01L 29/423 (2006.01)

(52) U.S. Cl.
CPC ...... H01L 27/14612 (2013.01); H01L 27/146 (2013.01); H01L 27/14605 (2013.01);
(Continued)

(58) Field of Classification Search
None
See application file for complete search history.

(56) References Cited

U.S. PATENT DOCUMENTS 10,347,673 B2 * 7/2019 Otake ............... H01L 29/42372
2002/0088975 A1 * 7/2002 Furumiya ......... H01L 27/14843
257/E27.152

(Continued)

FOREIGN PATENT DOCUMENTS

JP 2006-041056 2/2006
JP 2008-124395 5/2008

(Continued)

OTHER PUBLICATIONS

International Search Report and Written Opinion for International (PCT) Patent Application No. PCT/JP2015/072321, dated Oct. 19, 2015.

(Continued)

Primary Examiner — Xiaoming Liu
(74) Attorney, Agent, or Firm — Sheridan Ross P.C.

(57) ABSTRACT

The present disclosure relates to a solid-state imaging device and an electronic device that are configured to suppress the occurrence of noise and white blemishes in an amplification transistor having an element separation region which is formed by ion implantation. An amplification transistor has an element separation region formed by ion implantation. A (Continued)

channel region insulating film which is at least a part of a gate insulating film above a channel region of the amplification transistor is thin compared to a gate insulating film of a selection transistor, and an element separation region insulating film which is at least a part of a gate insulating film above the element separation region of the amplification transistor is thick compared to the channel region insulating film. The present disclosure can be applied to, for example, a CMOS image sensor, etc.

20 Claims, 22 Drawing Sheets

(52) U.S. Cl.
CPC .. *H01L 27/14607* (2013.01); *H01L 27/14687* (2013.01); *H01L 29/1033* (2013.01); *H01L 29/42372* (2013.01)

(56) References Cited

U.S. PATENT DOCUMENTS

| | | | |
|---|---|---|---|
| 2002/0197800 | A1 | 12/2002 | Hashimoto et al. |
| 2004/0246046 | A1* | 12/2004 | Tanigawa ................ G05F 3/262 327/543 |
| 2007/0069259 | A1 | 3/2007 | Jeon |
| 2010/0118170 | A1* | 5/2010 | Matsumoto ....... H01L 27/14612 257/292 |
| 2011/0180859 | A1 | 7/2011 | Tatani |
| 2013/0049082 | A1 | 2/2013 | Kato et al. |
| 2014/0191290 | A1* | 7/2014 | Funao ............... H01L 27/14643 257/231 |

FOREIGN PATENT DOCUMENTS

| | | |
|---|---|---|
| JP | 2009-283552 | 12/2009 |
| JP | 2011-071347 | 4/2011 |
| JP | 2014-049671 | 3/2014 |
| WO | WO 2013/027524 | 2/2013 |

OTHER PUBLICATIONS

Official Action for U.S. Appl. No. 15/502,821, dated Jul. 27, 2017, 10 pages.
Official Action for U.S. Appl. No. 15/502,821, dated Feb. 23, 2018, 11 pages.
Official Action for U.S. Appl. No. 15/502,821, dated Sep. 19, 2018, 16 pages.
Notice of Allowance for U.S. Appl. No. 15/502,821, dated Feb. 25, 2019, 7 pages.

* cited by examiner

SOLID STATE IMAGE SENSOR AND ELECTRONIC DEVICE

CROSS REFERENCE TO RELATED APPLICATIONS

This application is a continuation of U.S. patent application Ser. No. 15/502,821, filed Feb. 9, 2017, which is a national stage application under 35 U.S.C. 371 and claims the benefit of PCT Application No. PCT/JP2015/072321 having an international filing date of Aug. 6, 2015, which designated the United States, which PCT application claimed the benefit of Japanese Patent Application No. 2014-166561 filed Aug. 19, 2014, the disclosures of which are incorporated herein by reference in their entirety.

TECHNICAL FIELD

The present disclosure relates to a solid-state imaging device and an electronic device, and more particularly to a solid-state imaging device and an electronic device that are configured to be able to suppress the occurrence of noise and white blemishes in an amplification transistor having element separation regions which are formed by ion implantation.

BACKGROUND ART

When fine pixel size of a CMOS image sensor is obtained, there is a need to reduce the sizes of pixel transistors. However, if the sizes of the pixel transistors are reduced, then random noise (RN) gets worse.

In addition, when fine pixel size is obtained, in order to secure the areas of photodiodes (PDs), generally, element separation is formed by ion implantation. In this case, however, due to the formation of a gate electrode of a pixel transistor above element separation regions, white blemishes (white spots) increase.

Meanwhile, fora method for suppressing 1/f noise, there is devised a method for reducing the thickness of a gate oxide film of an amplification transistor (see, for example, Patent Document 1). However, if the thicknesses of gate oxide films above element separation regions are reduced, dark current gets worse, increasing white blemishes.

In addition, there is devised the formation of oxide films above element separation regions and above a part of an element region by a deposition method in order to block source/drain leakage caused by fixed charges in an enhancement type transistor when element separation is performed by a local oxidation of silicon (LOCOS) method (see, for example, Patent Document 2).

CITATION LIST

Patent Document

Patent Document 1: Japanese Patent Application Laid-Open No. 2008-124395
Patent Document 2: Japanese Patent Application Laid-Open No. H02-144968

SUMMARY OF THE INVENTION

Problems to be Solved by the Invention

However, suppression of the occurrence of noise and white blemishes in an amplification transistor having element separation regions which are formed by ion implantation is not considered.

The present disclosure is made in view of such circumstances, and is to enable to suppress the occurrence of noise and white blemishes in an amplification transistor having element separation regions which are formed by ion implantation.

Solutions to Problems

A solid-state imaging device of a first aspect of the present disclosure includes: an amplification transistor having an element separation region formed by ion implantation; and a transistor, wherein a channel region insulating film is configured to be thin compared to a gate insulating film of the transistor, and an element separation region insulating film is configured to be thick compared to the channel region insulating film, the channel region insulating film being at least a part of a gate insulating film above a channel region of the amplification transistor, and the element separation region insulating film being at least a part of a gate insulating film above the element separation region of the amplification transistor.

In the first aspect of the present disclosure, there are provided an amplification transistor having an element separation region which is formed by ion implantation; and a transistor. A channel region insulating film which is at least a part of a gate insulating film above a channel region of the amplification transistor is thin compared to a gate insulating film of the transistor, and an element separation region insulating film which is at least a part of a gate insulating film above the element separation region of the amplification transistor is thick compared to the channel region insulating film.

An electronic device of a second aspect of the present disclosure includes: an amplification transistor having an element separation region formed by ion implantation; and a transistor, wherein a channel region insulating film is configured to be thin compared to a gate insulating film of the transistor, and an element separation region insulating film is configured to be thick compared to the channel region insulating film, the channel region insulating film being at least a part of a gate insulating film above a channel region of the amplification transistor, and the element separation region insulating film being at least a part of a gate insulating film above the element separation region of the amplification transistor.

In the second aspect of the present disclosure, there are provided an amplification transistor having an element separation region which is formed by ion implantation; and a transistor. A channel region insulating film which is at least a part of a gate insulating film above a channel region of the amplification transistor is thin compared to a gate insulating film of the transistor, and an element separation region insulating film which is at least a part of a gate insulating film above the element separation region of the amplification transistor is thick compared to the channel region insulating film.

Effects of the Invention

According to the first and second aspects of the present disclosure, an image can be captured. In addition, according to one aspect of the present disclosure, the occurrence of noise and white blemishes in an amplification transistor having an element separation region which is formed by ion implantation can be suppressed.

Note that effects are not necessarily limited to the effects described here and may be any of the effects described in the present disclosure.

MODE FOR CARRYING OUT THE INVENTION

Premises of the present disclosure and modes for carrying out the present disclosure (hereinafter, referred to as embodiments) will be described below. Note that the description is made in the following order:

1. First embodiment: CMOS image sensor (FIGS. 1 to 22)
2. Second embodiment: imaging apparatus (FIG. 23)

First Embodiment

Exemplary Configuration of One Embodiment of a CMOS Image Sensor

Figure 1:
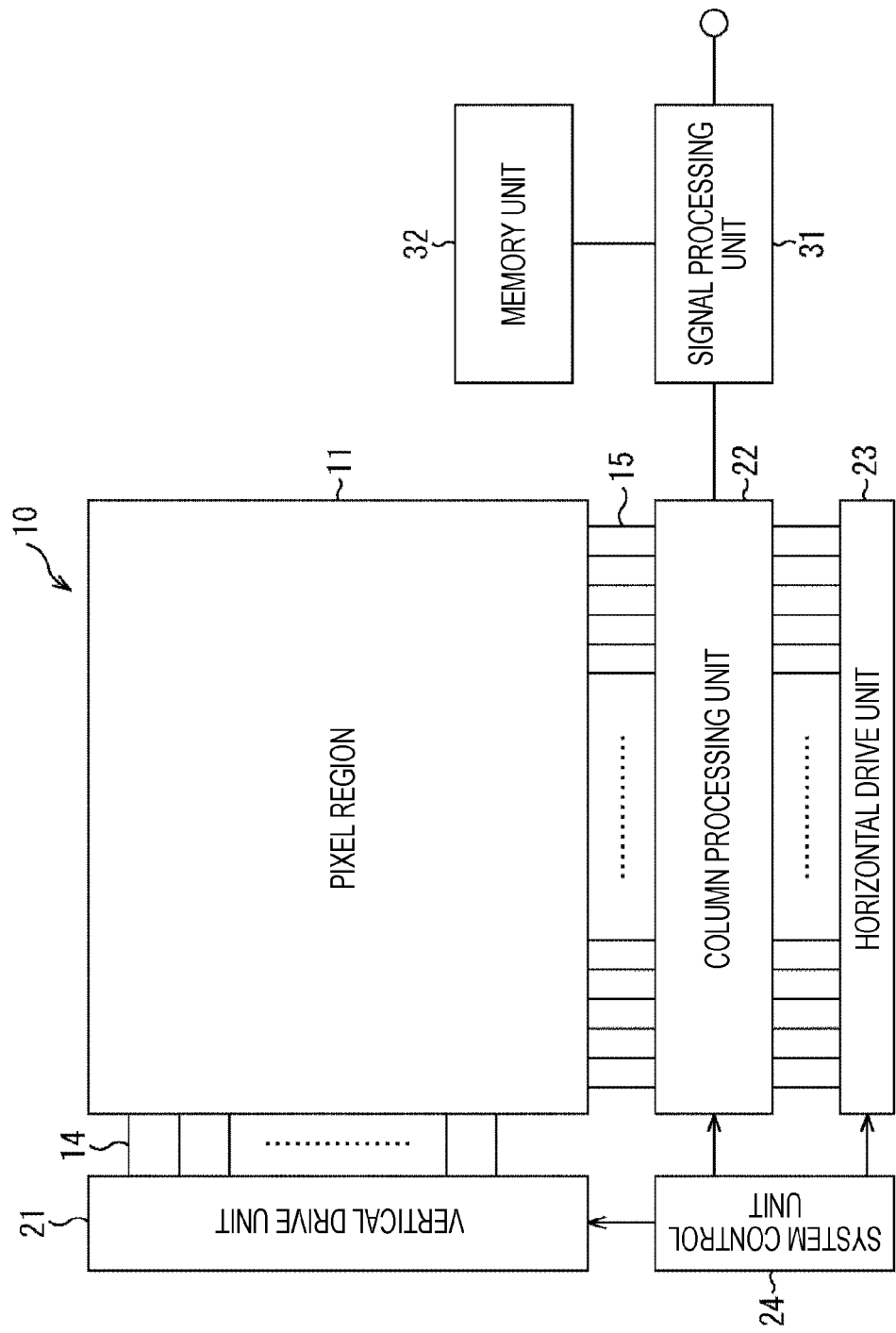
FIG. 1 is a block diagram showing an exemplary configuration of one embodiment of a CMOS image sensor to which the present disclosure is applied.

FIG. 1 is a block diagram showing an exemplary configuration of one embodiment of a CMOS image sensor to which the present disclosure is applied.

A CMOS image sensor 10 has a pixel region 11, pixel drive lines 14, vertical signal lines 15, a vertical drive unit 21, a column processing unit 22, a horizontal drive unit 23, a system control unit 24, a signal processing unit 31, and a memory unit 32 which are formed on a semiconductor substrate (chip) such as a silicon substrate which is not shown. The CMOS image sensor 10 captures an image of a subject and outputs pixel signals of respective pixels.

Specifically, pixels, each having a photoelectric conversion element that generates an amount of charge according to the amount of incident light and accumulates the charge therein, are two-dimensionally arranged in a matrix form in the pixel region 11, and the pixel region 11 performs imaging. In addition, in the pixel region 11, the pixel drive lines 14 are formed for the respective rows of the pixels in a matrix form, and the vertical signal lines 15 are formed for the respective columns.

The vertical drive unit 21 is composed of a shift register, an address decoder, etc., and drives the pixels in the pixel region 11 on a row-by-row basis, etc. One ends of the respective pixel drive lines 14 are connected to output terminals (not shown) of the vertical drive unit 21 which are provided for the respective rows. Though a depiction of a specific configuration of the vertical drive unit 21 is omitted, the vertical drive unit 21 is configured to have two scanning systems: a read-out scanning system and a sweep-out scanning system.

The read-out scanning system selects the rows in turn so as to read, in turn, pixel signals from the pixels on a row-by-row basis, and outputs a transfer pulse and a selection pulse from a corresponding output terminal connected to a pixel drive line 14 of the selected row.

The sweep-out scanning system outputs transfer pulses and reset pulses from the output terminals connected to the pixel drive lines 14 of the respective rows, earlier by the amount of time corresponding to shutter speed than scanning by the read-out system in order to sweep out (reset) unnecessary charges from the photoelectric conversion elements. By this scanning by the sweep-out scanning system, so-called electronic shutter operation is performed in turn on a row-by-row basis. Here, the electronic shutter operation refers to the operation of discarding charges in the photoelectric conversion elements and newly starting exposure (starting accumulation of charges).

Pixel signals outputted from pixels of the row selected by the read-out scanning system of the vertical drive unit 21 are supplied to the column processing unit 22 through the respective vertical signal lines 15.

The column processing unit 22 has signal processing circuits for the respective columns of the pixel region 11. The signal processing circuits of the column processing unit 22 perform signal processing, such as a noise removal process, e.g., a correlated double sampling (CDS) process, and an analog/digital (A/D) conversion process, on the pixel signals outputted through the vertical signal lines 15 from the pixels of the selected row. The column processing unit 22 temporarily holds the pixel signals having been subjected to the signal processing.

The horizontal drive unit 23 is composed of a shift register, an address decoder, etc., and selects, in turn, the signal processing circuits of the column processing unit 22. By this selection scanning by the horizontal drive unit 23, the pixel signals having been subjected to the signal processing by the signal processing circuits of the column processing unit 22 are outputted in turn to the signal processing unit 31.

The system control unit 24 is composed of, for example, a timing generator that generates various types of timing signals, and controls the vertical drive unit 21, the column processing unit 22, and the horizontal drive unit 23 on the basis of the various types of timing signals generated by the timing generator.

The signal processing unit 31 has at least an addition processing function. The signal processing unit 31 performs various signal processing, such as an addition process, on the pixel signals outputted from the column processing unit 22. At this time, the signal processing unit 31 stores, as necessary, in-progress results of the signal processing, etc., in the memory unit 32 and refers to the in-progress results, etc., at required timing. The signal processing unit 31 outputs the pixel signals having been subjected to the signal processing.

The memory unit 32 is composed of a dynamic random access memory (DRAM), a static random access memory (SRAM), etc.

First Exemplary Configuration of Pixels

Figure 2:
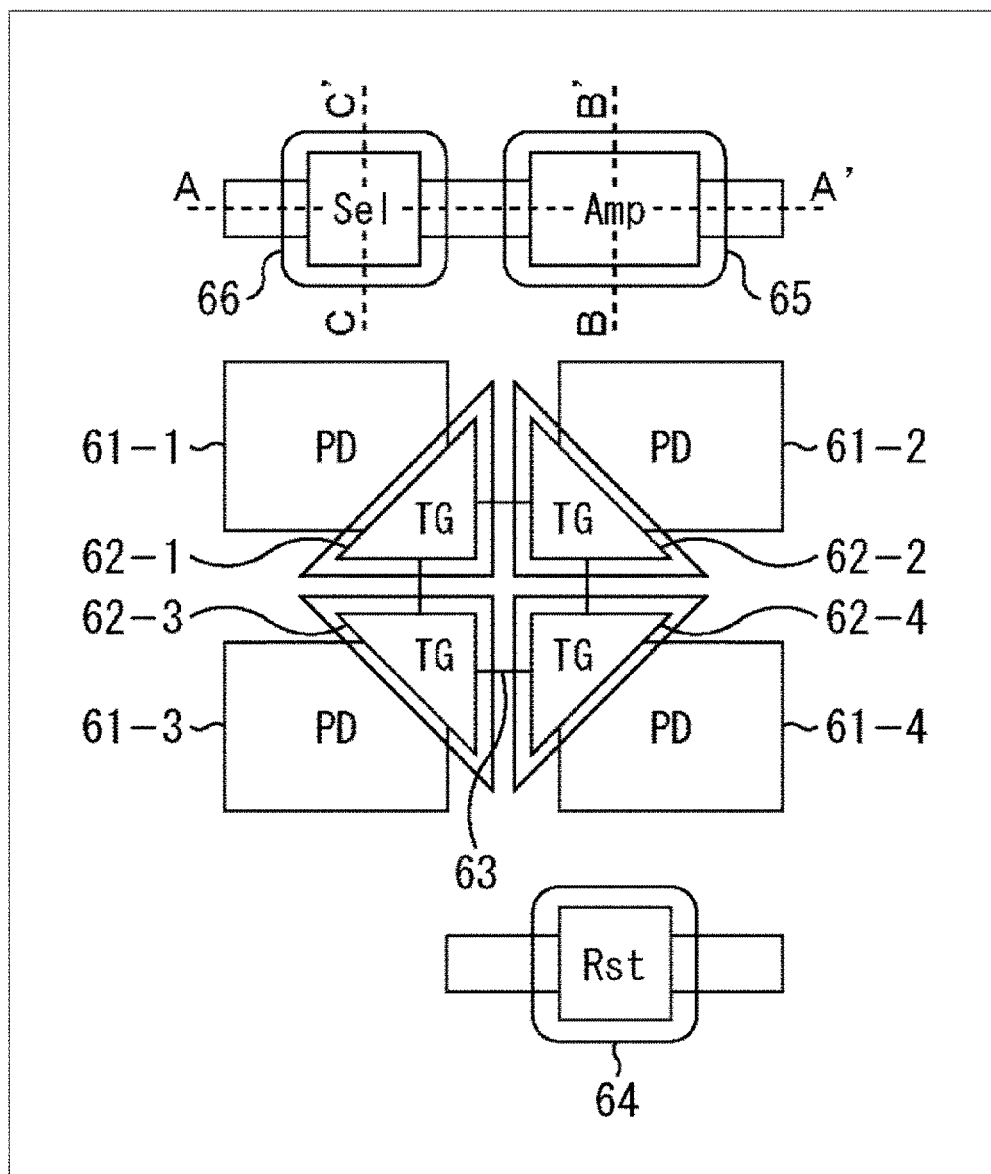
FIG. 2 is a top view showing a first exemplary configuration of 2×2 pixels.

FIG. 2 is a top view showing a first exemplary configuration of 2 (columns)×2 (rows) pixels arranged in the pixel region 11 of FIG. 1.

As shown in FIG. 2, for the 2×2 pixels, there are formed photodiodes (PDs) 61-1 to 61-4 serving as photoelectric conversion elements of the respective pixels; transfer transistors 62-1 to 62-4 of the respective pixels; and an FD 63 including floating diffusions (FDs) of the respective pixels. In addition, a selection transistor 66 and an amplification transistor 65 which are shared by the 2×2 pixels are formed above the PD 61-1 and the PD 61-2 in the drawing, and a reset transistor 64 which is shared by the 2×2 pixels is formed below the PD 61-3 and the PD 61-4 in the drawing.

Note that, in the following, when the PDs 61-1 to 61-4 do not need to be particularly distinguished from each other, they are collectively referred to as PDs 61. Likewise, the transfer transistors 62-1 to 62-4 are collectively referred to as transfer transistors 62.

Each PD 61 generates a charge according to the amount of received light and accumulates the charges. Each transfer transistor 62 reads the charge accumulated in a corresponding PD 61 when the transfer transistor 62 is turned on by a transfer pulse supplied from a corresponding pixel drive line 14 of FIG. 1, and transfers the charge to the FD 63.

The FD 63 holds the charge read from the PD 61. The reset transistor 64 is a depression type transistor. When the reset transistor 64 is turned on by a reset pulse supplied from a corresponding pixel drive line 14, the reset transistor 64 discharges the charge accumulated in the FD 63 to a constant voltage source, and thereby resets the potential of the FD 63.

The amplification transistor 65 is a depression type transistor, and is connected in series with the selection transistor 66. A gate electrode of the amplification transistor 65 is connected to the FD 63, and the amplification transistor 65 outputs a pixel signal according to the potential of the FD 63 to the selection transistor 66, using a power supply. The selection transistor 66 is a depression type transistor. When the selection transistor 66 is turned on by a selection pulse supplied from a corresponding pixel drive line 14, the selection transistor 66 supplies the pixel signal outputted from the amplification transistor 65, to the column processing unit 22 through a corresponding vertical signal line 15.

Note that in the example of FIG. 2 the reset transistor 64, the amplification transistor 65, and the selection transistor 66 are shared by the 2×2 pixels, but may be provided for each pixel.

Figure 3:
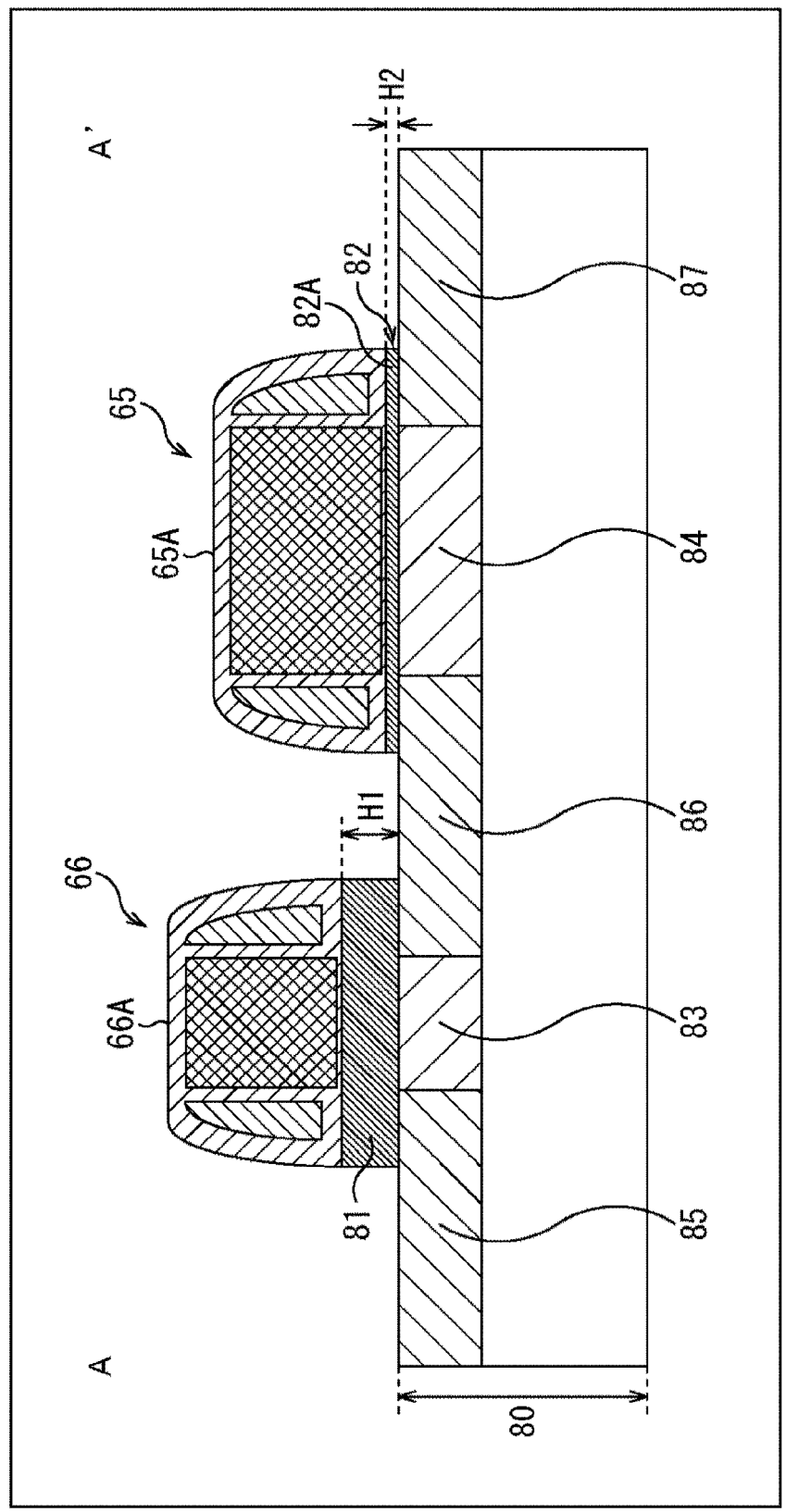
FIG. 3 is an A-A' cross-sectional view of FIG. 2.
Figure 4:
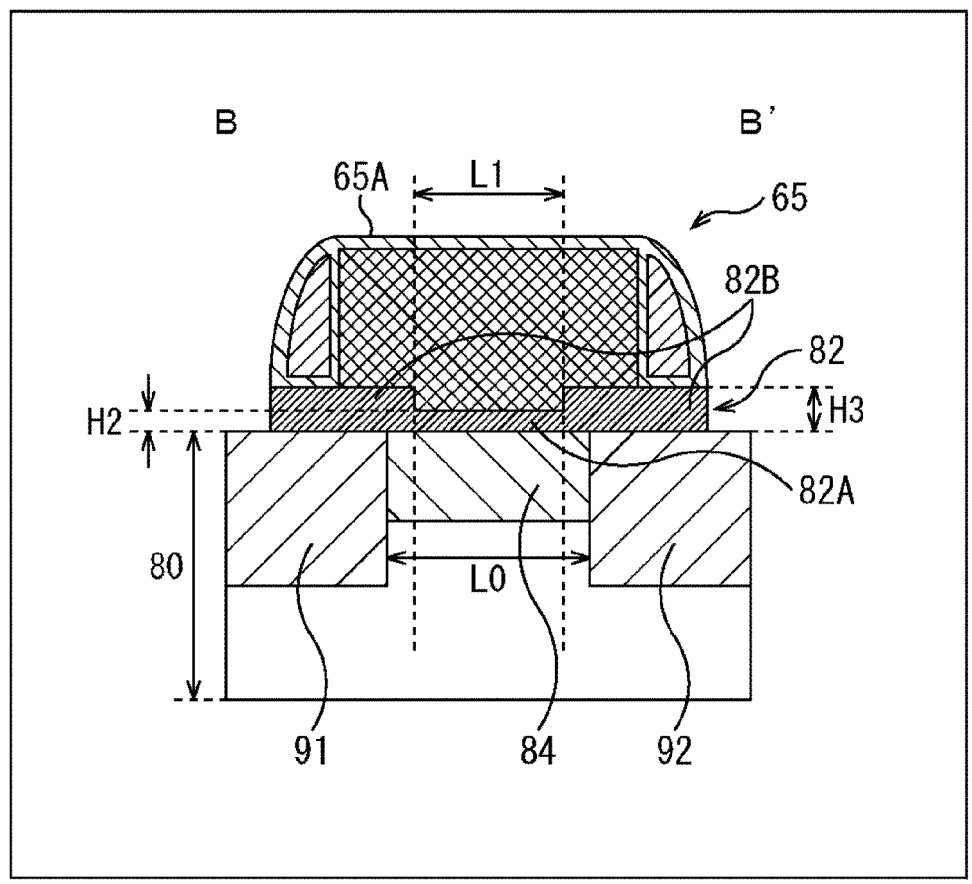
FIG. 4 is a B-B' cross-sectional view of FIG. 2.
Figure 5:
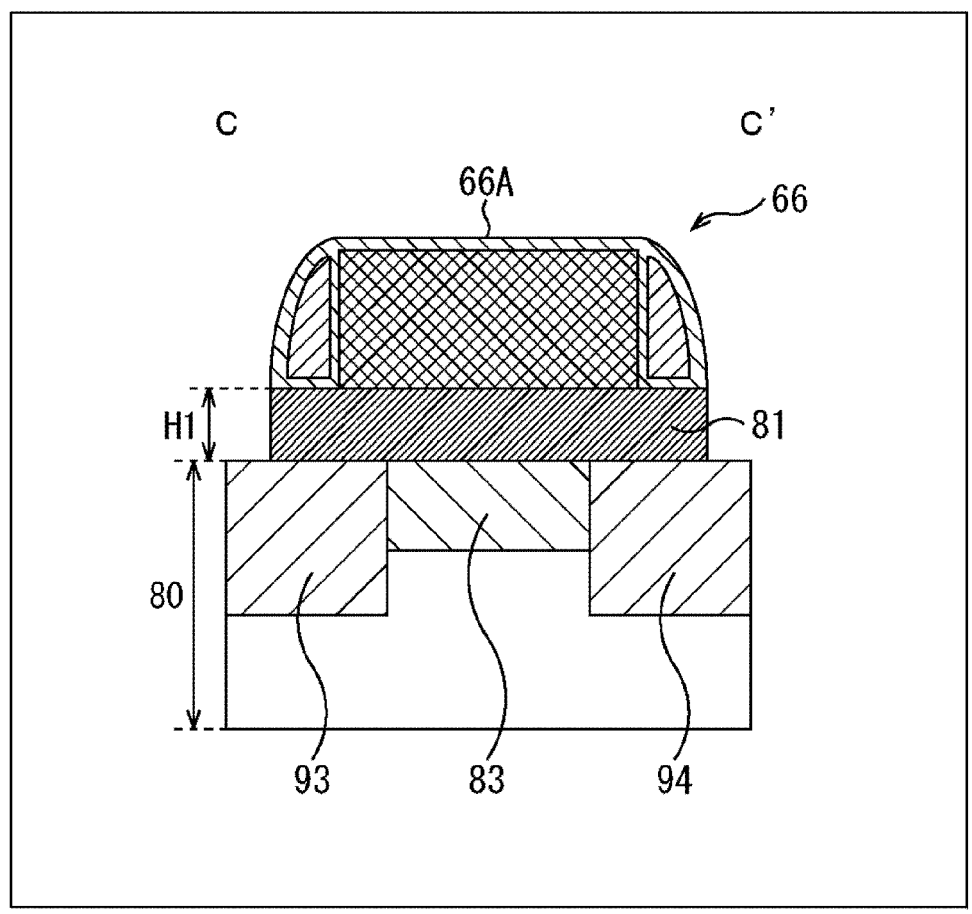
FIG. 5 is a C-C' cross-sectional view of FIG. 2.

FIG. 3 is an A-A' cross-sectional view of FIG. 2, FIG. 4 is a B-B' cross-sectional view of FIG. 2, and FIG. 5 is a C-C' cross-sectional view of FIG. 2.

As shown in FIG. 3, a gate electrode 66A of the selection transistor 66 is formed on a semiconductor substrate 80 with a gate insulating film 81 interposed therebetween. In addition, a gate electrode 65A of the amplification transistor 65 is formed on the semiconductor substrate 80 with a gate insulating film 82 interposed therebetween. For the gate insulating film 81 and the gate insulating film 82, an oxide film, an oxynitride film, a high-k film, etc., can be adopted.

A channel region 83 of the selection transistor 66 is formed in a portion of the semiconductor substrate 80 below the gate electrode 66A, and a channel region 84 of the amplification transistor 65 is formed in a portion of the semiconductor substrate 80 below the gate electrode 65A.

In addition, source/drain regions 85 and 86 are formed in the semiconductor substrate 80 so as to sandwich the channel region 83, and function as source/drain regions of the selection transistor 66. In addition, a source/drain region 87 is formed in the semiconductor substrate 80 so as to sandwich the channel region 84 with the source/drain region 86. The source/drain region 86 and the source/drain region 87 function as source/drain regions of the amplification transistor 65.

As shown in FIG. 4, the amplification transistor 65 has element separation regions 91 and 92 which are formed by ion implantation. In addition, as shown in FIG. 5, the selection transistor 66 has element separation regions 93 and 94 which are formed by ion implantation.

As shown in FIG. 4, a film thickness H2 of a channel region insulating film 82A which is a central portion of the gate insulating film 82 above the channel region 84 is thin compared to a film thickness H1 of the gate insulating film 81 of the selection transistor 66. In addition, a film thickness H3 of element separation region insulating films 82B, each including a portion of the gate insulating film 82 above a boundary between the channel region 84 and the element separation region 91, 92 and the whole portion of the gate insulating film 82 above the element separation region 91, 92, is thick compared to the film thickness H2.

In addition, as shown in FIG. 4, a width L1 in a W direction (channel width direction) of the channel region insulating film 82A is narrow compared to a channel width L0 of the amplification transistor 65.

The element separation region insulating films 82B are formed by, for example, thermal oxidation. By this, the element separation region insulating films 82B become pure films with a low defect level density, reducing noise sources.

Note that although, in the example of FIGS. 2 to 5, the amplification transistor 65 and the selection transistor 66 share their source/drain region and the one source/drain region 86 is formed, instead of sharing, source/drain regions may be formed separately.

In addition, although in the above-described description, of pixel transistors other than the amplification transistor 65, only the selection transistor 66 is described, the transfer transistors 62 and the reset transistor 64 are also configured in a similar manner to the selection transistor 66.

Figure 6:
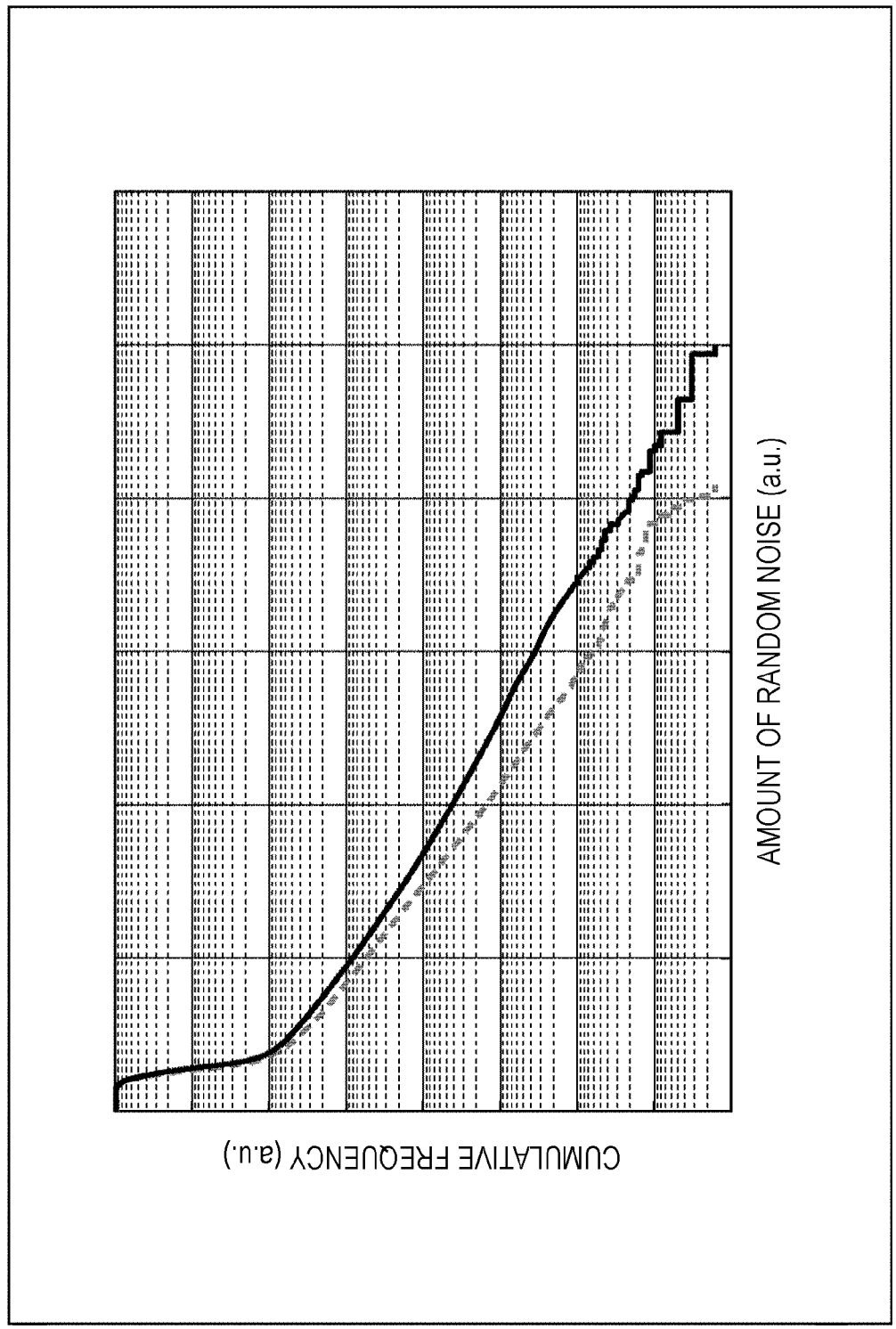
FIG. 6 is a graph showing a relationship between the film thickness of a gate insulating film of an amplification transistor and random noise.

Relationship Between the Film Thickness of a Gate Insulating Film and Random Noise FIG. 6 is a graph showing a relationship between the film thickness of a gate insulating film of an amplification transistor and random noise.

In FIG. 6, a horizontal axis represents the amount of random noise and a vertical axis represents the cumulative frequency of each amount of random noise. In addition, in FIG. 6, a dotted line represents the cumulative frequency of each amount of random noise for the amplification transistor 65, and a solid line represents the cumulative frequency of each amount of random noise for an amplification transistor having gate insulating films whose film thicknesses are all H3.

As shown in FIG. 6, in the amplification transistor 65 where the film thickness H2 of the channel region insulating film 82A is thin compared to the film thickness H3, random noise is reduced compared to the amplification transistor having gate insulating films whose film thicknesses are all H3.

In addition, though not shown, in the amplification transistor 65 where the film thickness H2 of the channel region insulating film 82A is thin compared to the film thickness H3, random telegraph noise (RTS) is also reduced compared to the amplification transistor having gate insulating films whose film thicknesses are all H3.

As described above, random noise and random telegraph noise can be reduced with a thinner film thickness of a gate insulating film of an amplification transistor.

Figure 7:
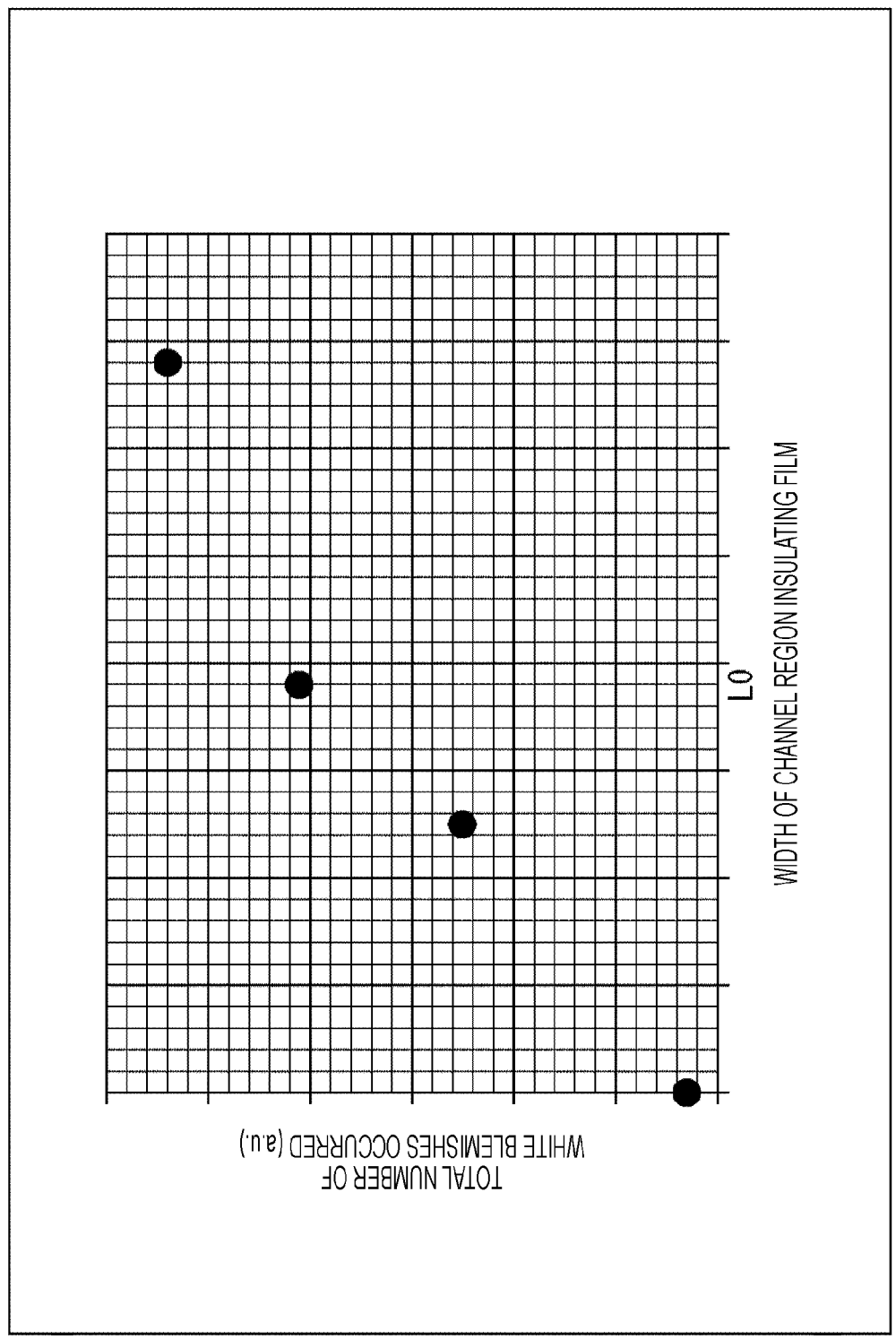
FIG. 7 is a graph showing a relationship between the width in a W direction of a channel region insulating film and white blemishes.

Relationship Between the Width in the W Direction of the Channel Region Insulating Film and White Blemishes FIG. 7 is a graph showing a relationship between the width in the W direction of the channel region insulating film and white blemishes.

In FIG. 7, a horizontal axis represents the width in the W direction of the channel region insulating film, and a vertical axis represents the total number of white blemishes occurred.

As shown in FIG. 7, the larger the width of the channel region insulating film, the higher the total number of white blemishes occurred. For example, when the film thickness of gate insulating films above the boundaries between the channel region 84 and the element separation regions 91 and 92 is the film thickness H2 which is thin compared to the film thickness H3, i.e., when the width of the channel region insulating film is wider than the channel width L0, a large amount of dark current is generated and accordingly many white blemishes occur.

As described above, random noise and random telegraph noise can be reduced with a thinner film thickness of the gate insulating film of the amplification transistor, but when the film thickness of the gate insulating films above the boundaries between the channel region 84 and the element separation regions 91 and 92 is thin, many white blemishes occur.

Therefore, in the CMOS image sensor 10, the film thickness H2 of the channel region insulating film 82A of the amplification transistor 65 is made thin compared to the film thickness H1 of the gate oxide film 81, and the film thickness H3 of the element separation region insulating films 82B is made thick compared to the film thickness H2 of the channel region insulating film 82A. By this, the occurrence of random noise and random telegraph noise and white blemishes in the amplification transistor 65 can be suppressed.

In addition, in the CMOS image sensor 10, since the element separation regions 91 to 94 are formed by ion implantation, fine pixels can be obtained.

Furthermore, in the CMOS image sensor 10, since only the gate insulating film 82 of the amplification transistor 65 is made thin, leakage can be suppressed.

Namely, a low voltage applied to the gate electrode 65A of the amplification transistor 65 is higher than low voltages applied to the gate electrodes of the transfer transistors 62, the reset transistor 64, and the selection transistor 66. For example, the low voltages for the selection transistor 66 and the reset transistor 64 are 0 V or less, but the low voltage for the amplification transistor is 0 V or more.

Then, when the low voltage applied to the gate electrode is low, leakage occurs at a gate edge on the drain side and thus noise gets worse. In addition, when the film thickness of the gate insulating film is thin, leakage is likely to occur at the gate edge on the drain side. In the CMOS image sensor 10, only the gate insulating film 82 of the amplification transistor 65 where leakage is less likely to occur is made thin, and the gate insulating films of the transfer transistors 62, the reset transistor 64, and the selection transistor 66 where leakage is likely to occur are not made thin. Therefore, the occurrence of leakage can be suppressed.

Furthermore, since the width L1 in the W direction of the channel region insulating film 82A is narrow compared to the channel width L0, even if misalignment of an etching mask occurs upon reduction of the thickness of the channel region insulating film 82A, the channel region insulating film 82A is not disposed above the element separation regions 91 and 92, and accordingly, the occurrence of white blemishes can be suppressed. Namely, a margin of dark current can be secured.

Another Example of the Film Thickness of a Gate Insulating Film

Figure 8:
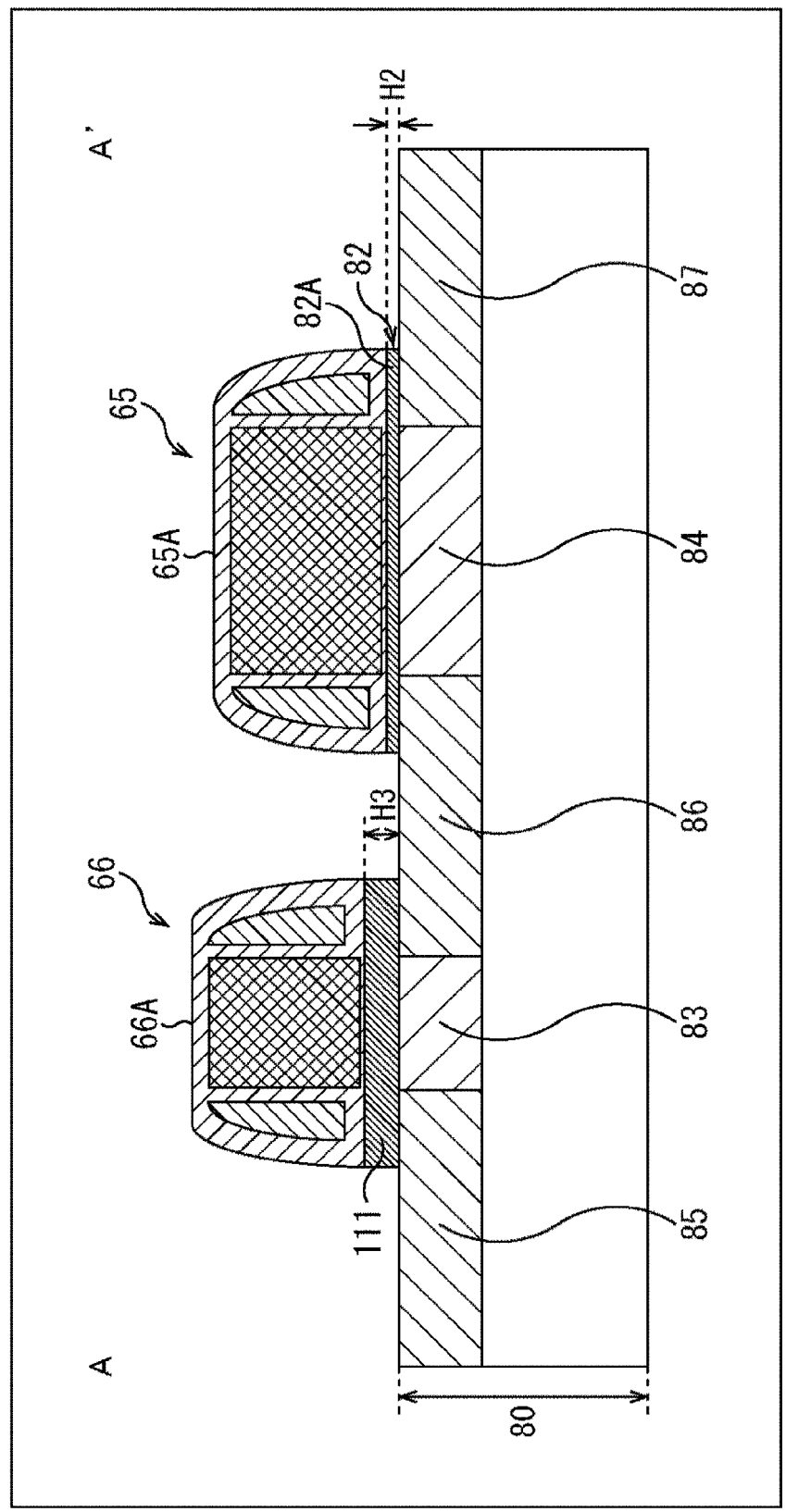
FIG. 8 is an A-A' cross-sectional view of FIG. 2 showing another example of the film thicknesses of gate insulating films.
Figure 9:
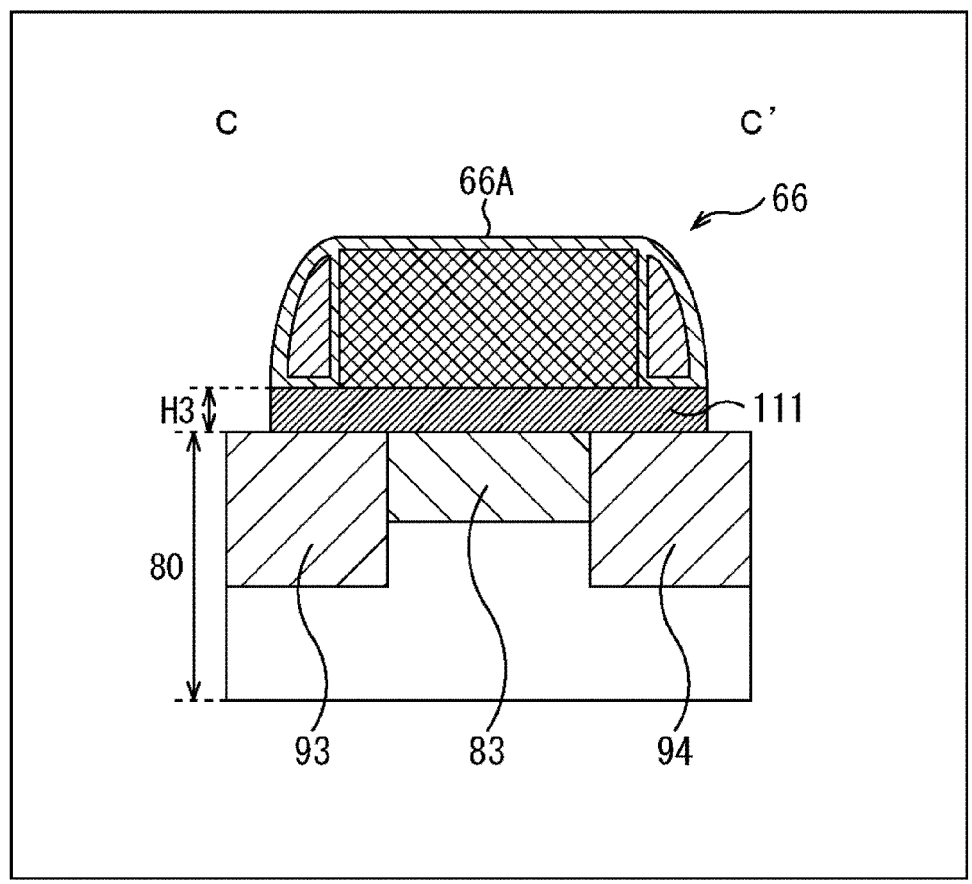
FIG. 9 is a C-C' cross-sectional view of FIG. 2 showing another example of the film thickness of the gate insulating film.

The element separation region insulating films and the gate insulating film of the selection transistor 66 may have the same thickness. In this case, an A-A' cross-sectional view of FIG. 2 is as shown in FIG. 8, a B-B' cross-sectional view of FIG. 2 is the same as in FIG. 4, and a C-C' cross sectional view of FIG. 2 is as shown in FIG. 9. Namely, the film thickness of a gate insulating film 111 of the selection transistor 66 is the film thickness H3 of the element separation region insulating films 82B.

Another Example of the Type of a Gate Insulating Film

Figure 10:
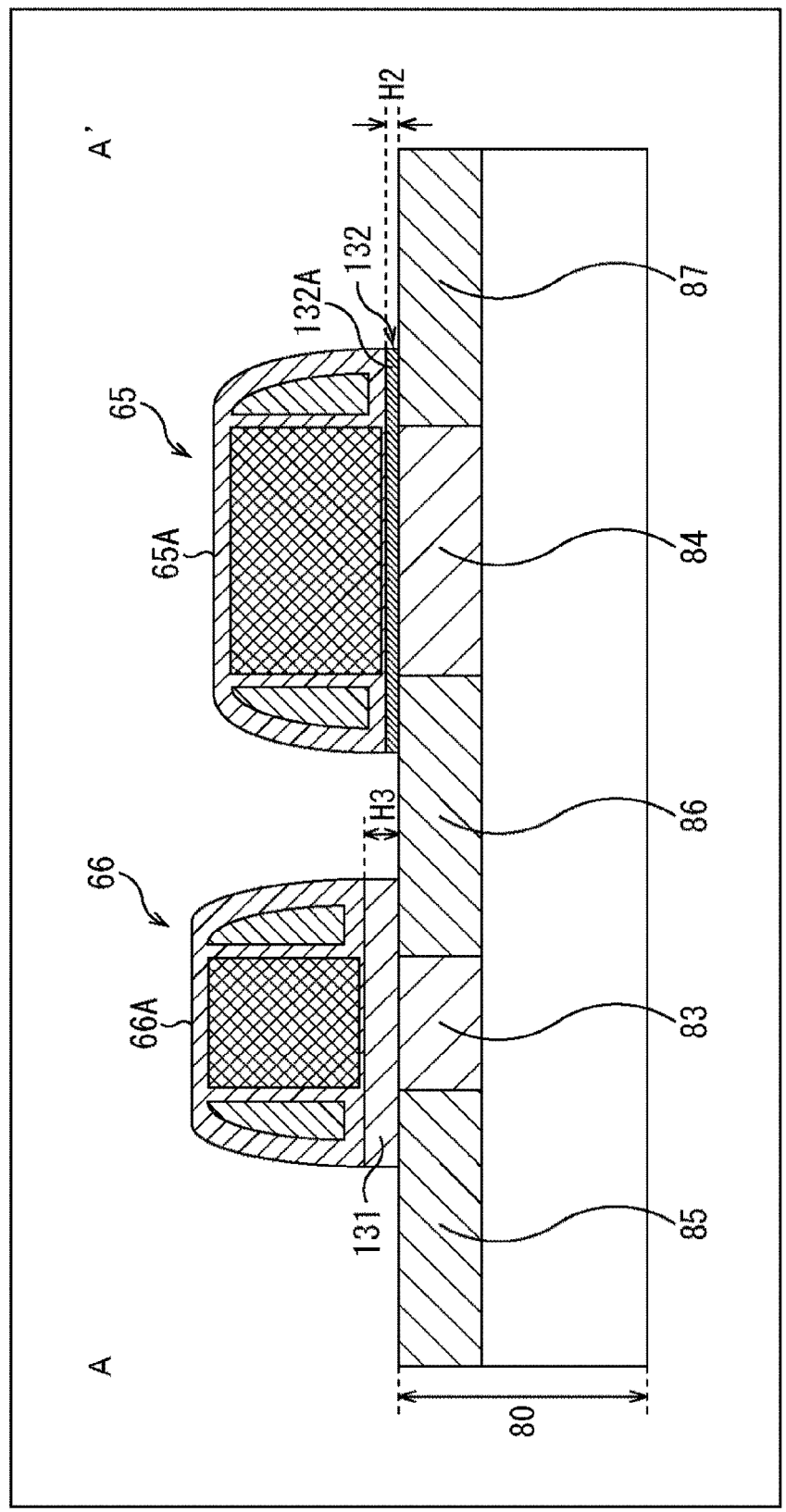
FIG. 10 is an A-A' cross-sectional view of FIG. 2 showing another example of the types of gate insulating films.
Figure 11:
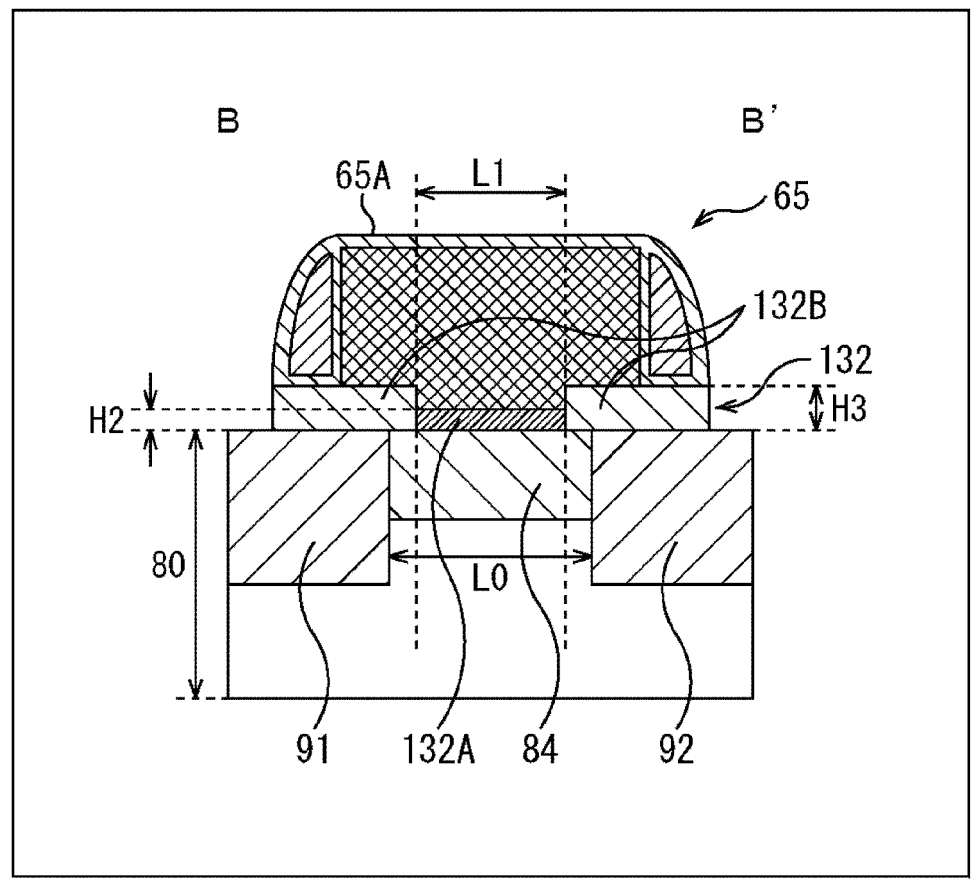
FIG. 11 is a B-B' cross-sectional view of FIG. 2 showing another example of the type of the gate insulating film.
Figure 12:
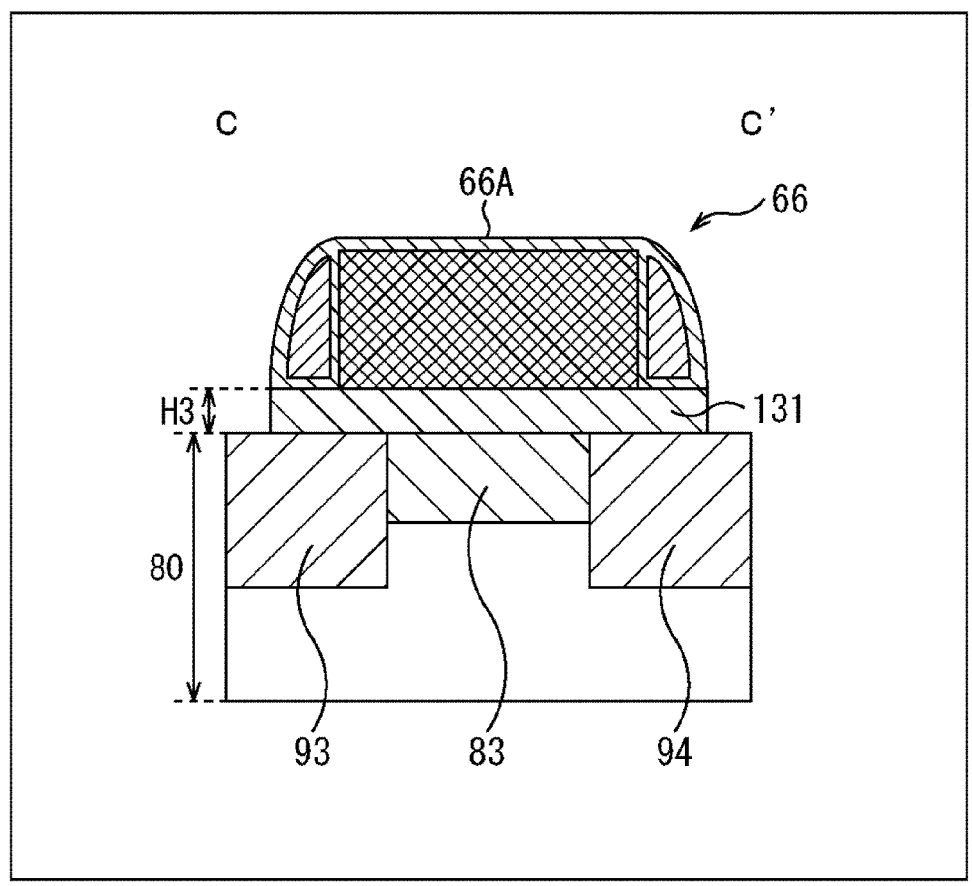
FIG. 12 is a C-C' cross-sectional view of FIG. 2 showing another example of the type of the gate insulating film.

The element separation region insulating films and the gate insulating film of the selection transistor 66 may be of the same type. In this case, an A-A' cross-sectional view of FIG. 2 is as shown in FIG. 10, a B-B' cross-sectional view of FIG. 2 is as shown in FIG. 11, and a C-C' cross sectional view of FIG. 2 is as shown in FIG. 12.

Namely, a gate insulating film 131 of the selection transistor 66 and element separation region insulating films 132B of the amplification transistor 65 are of the same type. The type of a channel region insulating film 132A of the amplification transistor 65 may be the same as or different from the type of the gate insulating film 131 and the element separation region insulating films 132B.

In addition, here, the gate insulating film 131 and the element separation region insulating films 132B have the same film thickness H3, but may have different film thicknesses. When the gate insulating film 131 and the element separation region insulating films 132B have the same film thickness, in a process of forming the gate insulating film 131, the element separation region insulating films 132B can also be formed, and thus, the number of manufacturing processes is reduced.

Figure 13:
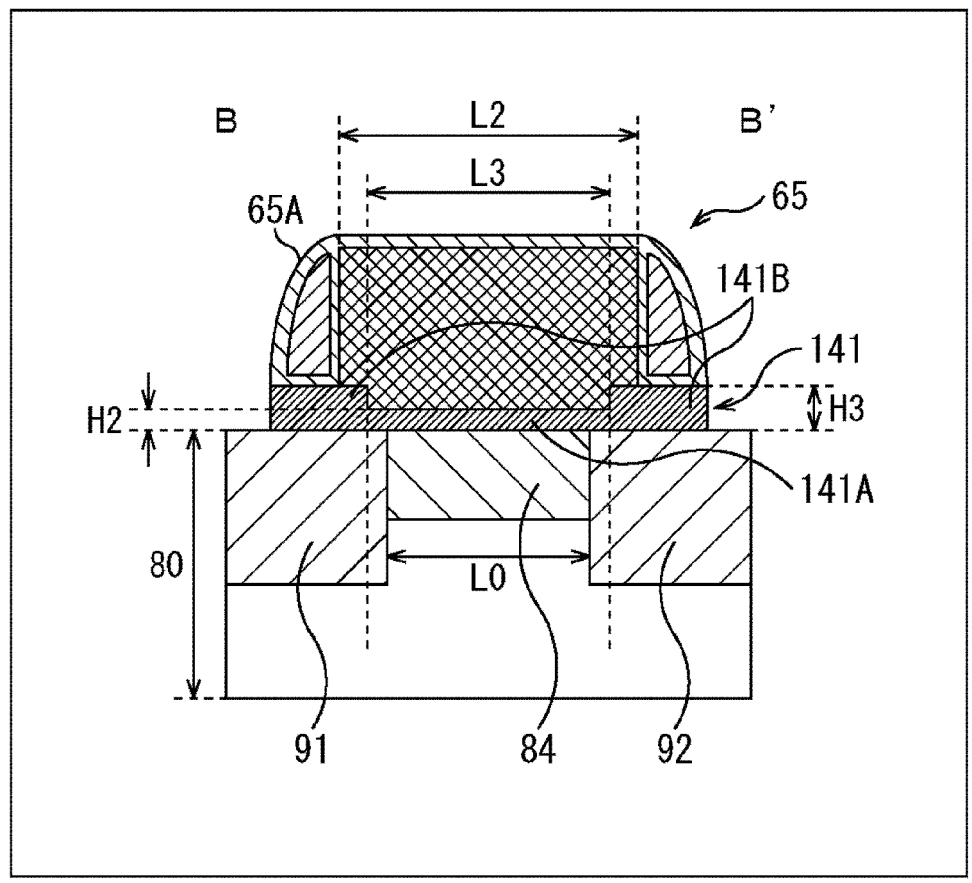
FIG. 13 is a B-B' cross-sectional view of FIG. 2 showing another example of the width in the W direction of a channel region insulating film.

Another Example of the Width in the W Direction of a Channel Region Insulating Film The width in the W direction of the channel region insulating film may be wide compared to the channel width L0 of the amplification transistor 65, and may be narrow compared to the width (gate width) in the W direction of the gate electrode 65A. In this case, a B-B' cross-sectional view of FIG. 2 is as shown in FIG. 13.

Namely, a width L3 in the W direction of a channel region insulating film 141A is wide compared to the channel width L0 of the amplification transistor 65, and is narrow compared to a gate width L2 of the amplification transistor. That is, the channel region insulating film 141A includes the whole gate insulating film above the channel region 84 and a part of the gate insulating films above the element separation regions 91 and 92, and element separation region insulating films 141B include the other part of the gate insulating films above the element separation regions 91 and 92.

In this case, even if misalignment of an etching mask occurs upon reduction of the thickness of the channel region insulating film 141A, the film thickness of the gate insulating film above the channel region 84 is securely made thin, enabling to suppress the occurrence of random noise and random telegraph noise. Namely, a margin of random noise and random telegraph noise can be secured.

Note that in this case the film thickness H3 of the element separation region insulating films 141B may be the same as or different from the film thickness of the gate oxide film of the selection transistor 66. Note also that the element separation region insulating films 141B and the gate insulating film of the selection transistor 66 may be of the same type or of different types.

Another Example of Element Separation Regions

Figure 14:
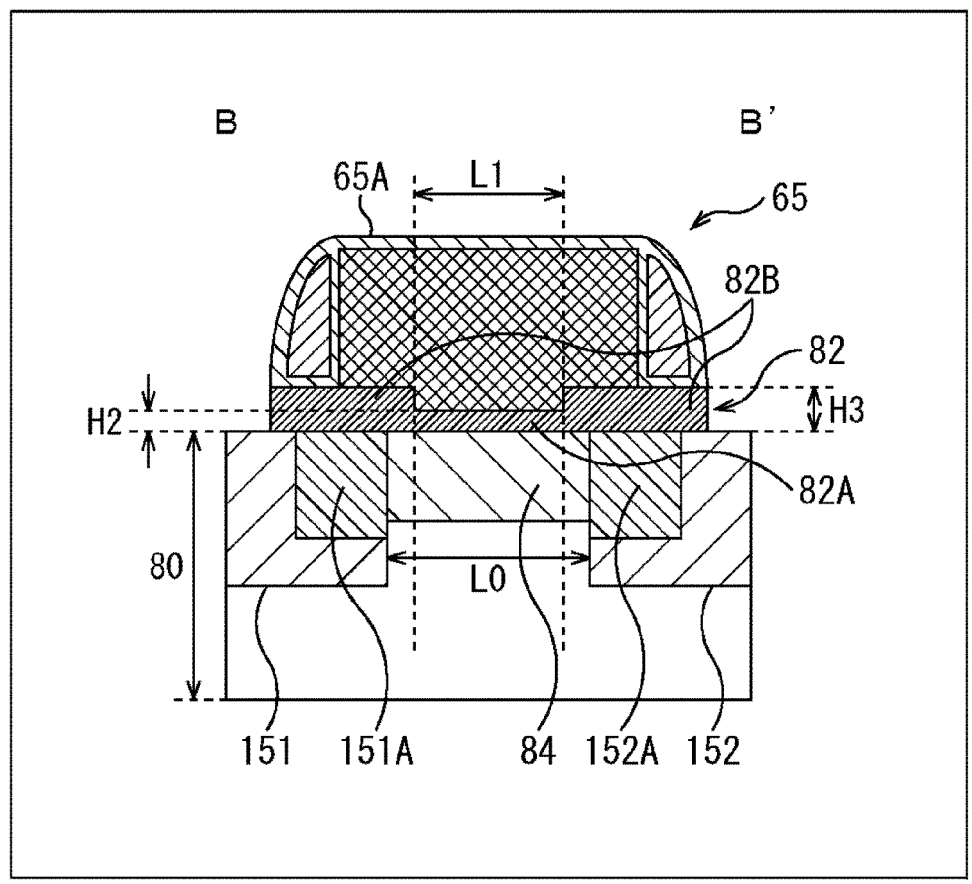
FIG. 14 is a B-B' cross-sectional view showing another example of element separation regions.

A part of the element separation regions may be formed of an insulating film. In this case, a B-B' cross-sectional view of FIG. 2 is as shown in FIG. 14. Namely, a part of an element separation region 151 formed in the semiconductor substrate 80 is formed of an insulating film 151A, and a part of an element separation region 152 is formed of an insulating film 152A.

In this case, interfaces between the semiconductor substrate 80 and the insulating films 151A and 152A become noise sources. However, since the element separation region insulating films 82B on the insulating films 151A and 152A are thick, a high electric field is prevented from being applied to the interfaces between the semiconductor substrate 80 and the insulating films 151A and 152A, and thus, noise is reduced.

Second Exemplary Configuration of Pixels

Figure 15:
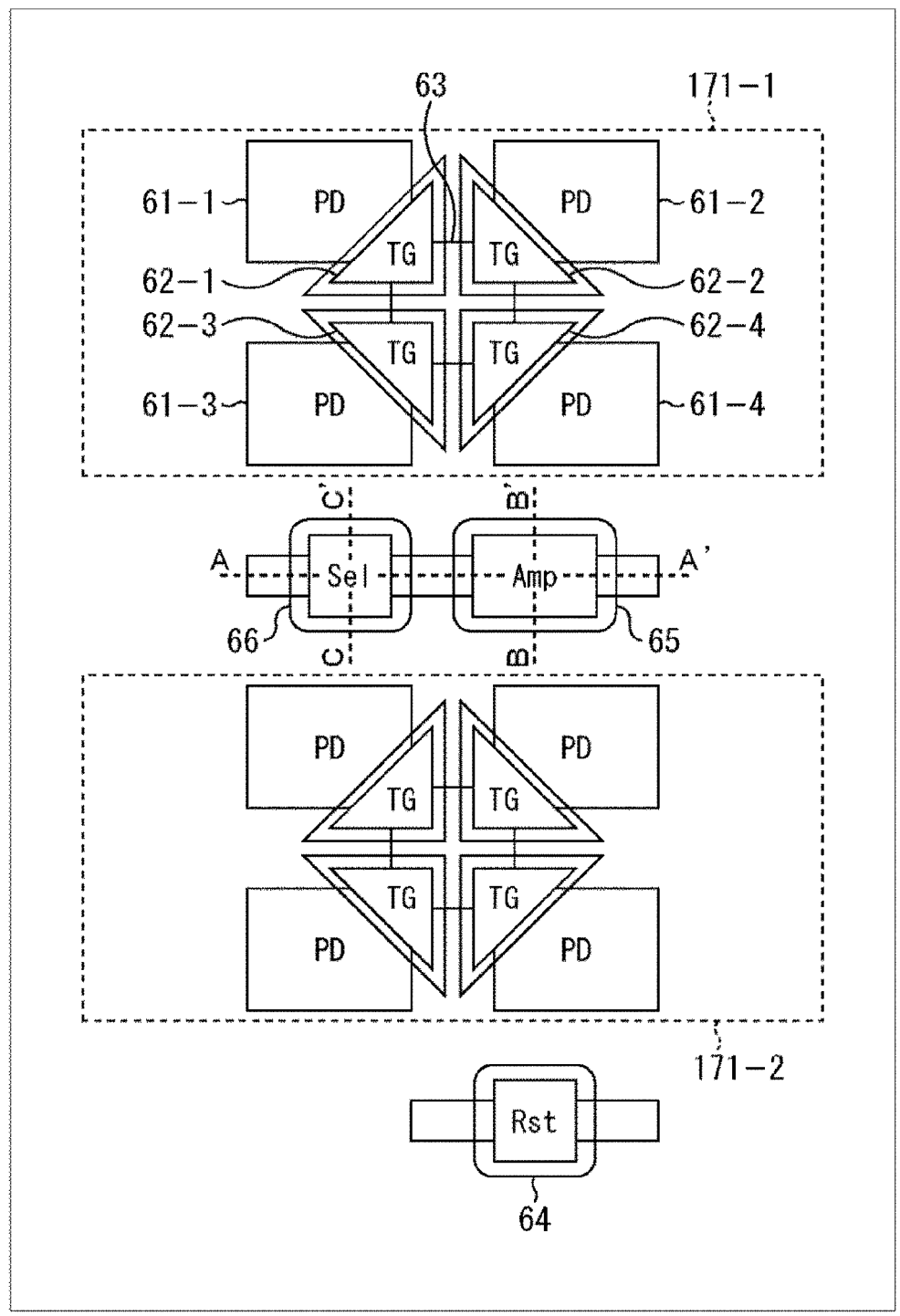
FIG. 15 is a top view showing a second exemplary configuration of 2×4 pixels.

FIG. 15 is a top view showing a second exemplary configuration of 2 (columns)×4 (rows) pixels arranged in the pixel region 11 of FIG. 1.

The configuration of FIG. 15 differs from the configuration of FIG. 2 mainly in that a reset transistor 64, an amplification transistor 65, and a selection transistor 66 are shared by the 2 (columns)×4 (rows) pixels.

Specifically, for the 2 (columns)×4 (rows) pixels of FIG. 15, there are formed two PD groups 171-1 and 171-2, each including PDs 61, transfer transistors 62, and an FD 63 for the 2 (columns)×2 (rows) pixels which are described in FIG. 2. In addition, the selection transistor 66 and the amplification transistor 65 which are shared by the 2 (columns)×4 (rows) pixels are formed between the PD group 171-1 and the PD group 171-2. Furthermore, the reset transistor 64 is formed below the PD group 171-2 in the drawing.

Note that another reset transistor for the 2 (columns)×4 (rows) pixels or a dummy transistor may be disposed on the left side in the drawing of the reset transistor 64.

An A-A' cross-sectional view of FIG. 15 is the same as the A-A' cross-sectional view of FIG. 3, a B-B' cross-sectional view of FIG. 15 is the same as the B-B' cross-sectional view of FIG. 4, and a C-C' cross-sectional view of FIG. 15 is the same as the C-C' cross-sectional view of FIG. 5, and thus, description thereof is omitted.

Third Exemplary Configuration of Pixels

Figure 16:
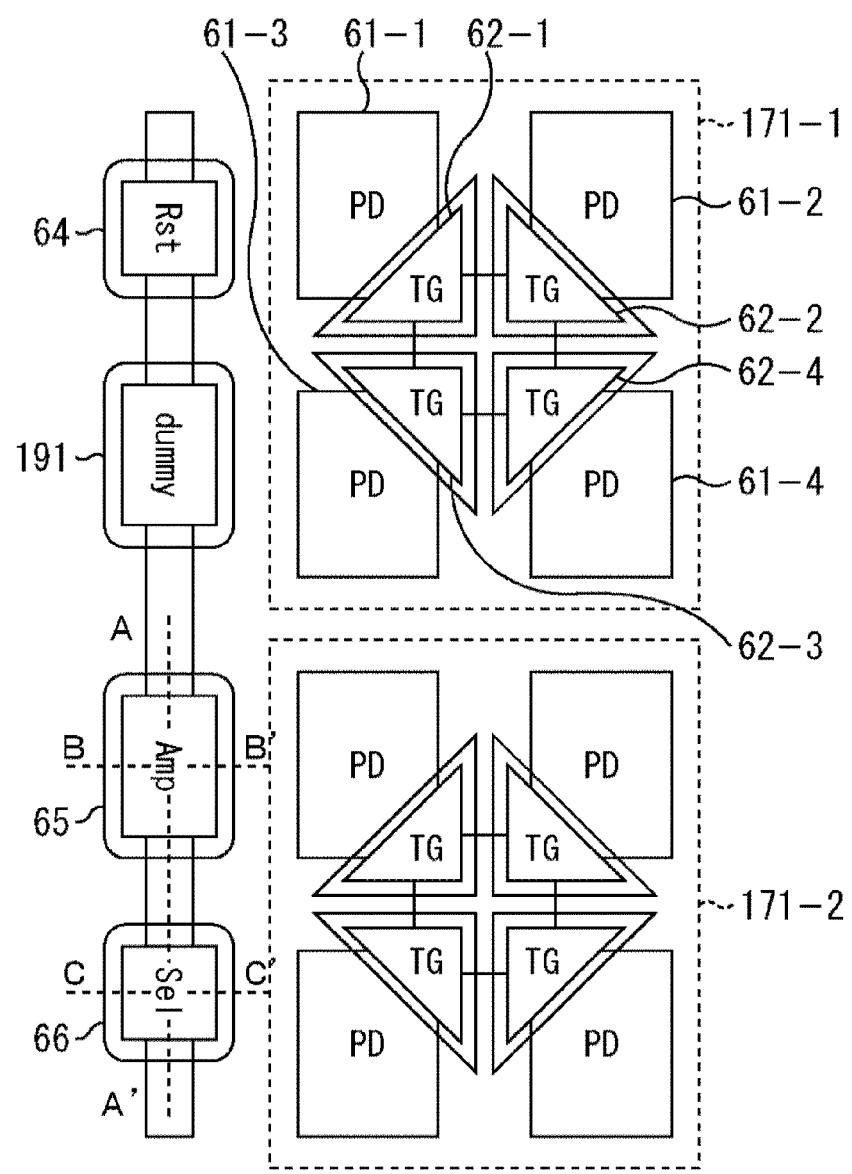
FIG. 16 is a top view showing a third exemplary configuration of 2×4 pixels.

FIG. 16 is a top view showing a third exemplary configuration of 2 (columns)×4 (rows) pixels arranged in the pixel region 11 of FIG. 1.

The configuration of FIG. 16 differs from the configuration of FIG. 15 in that a reset transistor 64, an amplification transistor 65, and a selection transistor 66 are located in a column direction (longitudinal direction), and that a dummy transistor 191 is newly provided.

Specifically, the reset transistor 64, the amplification transistor 65, and the selection transistor 66 are disposed, for example, on the left side in the drawing of PD groups 171-1 and 171-2. In addition, the amplification transistor 65 and the dummy transistor 191 share their source/drain region.

Note that instead of the dummy transistor 191, another reset transistor for the 2 (columns)×4 (rows) pixels may be disposed. Note also that the dummy transistor 191 may not be provided.

An A-A' cross-sectional view of FIG. 16 is the same as the A-A' cross-sectional view of FIG. 3, a B-B' cross-sectional view of FIG. 16 is the same as the B-B' cross-sectional view of FIG. 4, and a C-C' cross-sectional view of FIG. 16 is the same as the C-C' cross-sectional view of FIG. 5, and thus, description thereof is omitted.

Fourth Exemplary Configuration of Pixels

Figure 17:
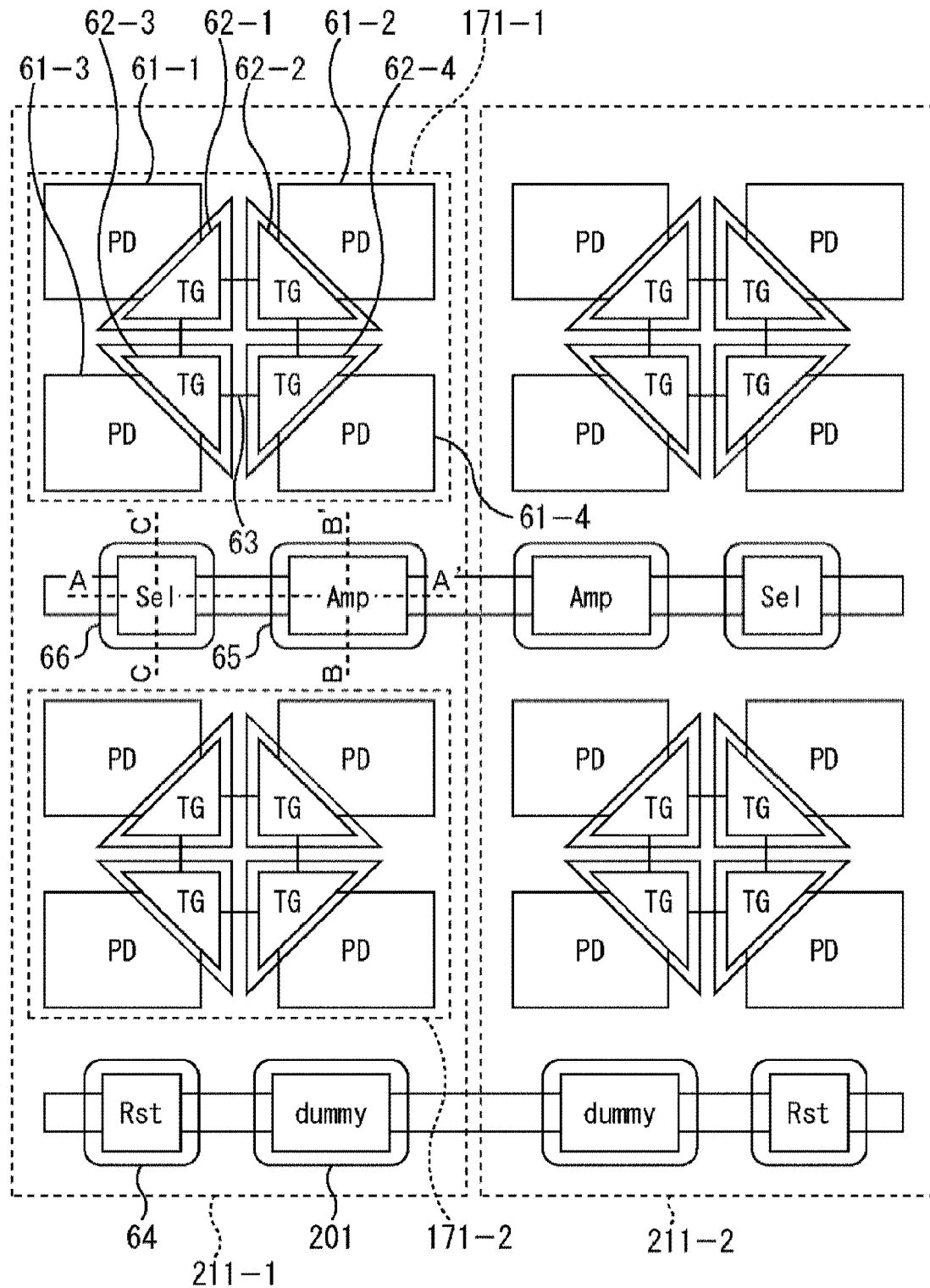
FIG. 17 is a top view showing a fourth exemplary configuration of 4×4 pixels.

FIG. 17 is a top view showing a fourth exemplary configuration of 4 (columns)×4 (rows) pixels arranged in the pixel region 11 of FIG. 1.

The configuration of FIG. 17 differs from the configuration of FIG. 15 in that a dummy transistor 201 is provided adjacent in a row direction (lateral direction) to a reset transistor 64, and that amplification transistors 65 share their source/drain region and the dummy transistors 201 share their source/drain region between 2 (columns)×4 (rows) pixels and 2 (columns)×4 (rows) pixels which are adjacent to each other in a horizontal direction.

Specifically, in 2 (columns)×4 (rows) pixels 211-1 of FIG. 17, a selection transistor 66 and the amplification transistor 65 are disposed in this order from the left in the drawing; on the other hand, in 2 (columns)×4 (rows) pixels 211-2 adjacent on the right in the drawing to the 2 (columns)×4 (rows)

pixels 211-1, the amplification transistor 65 and a selection transistor 66 are disposed in this order from the left in the drawing. Then, the amplification transistors 65 share their source/drain region between the 2 (columns)×4 (rows) pixels 211-1 and 211-2.

In addition, in the 2 (columns)×4 (rows) pixels 211-1 of FIG. 17, the reset transistor 64 and the dummy transistor 201 are disposed in this order from the left in the drawing; on the other hand, in the 2 (columns)×4 (rows) pixels 211-2, the dummy transistor 201 and the reset transistor 64 are disposed in this order from the left in the drawing. Then, the dummy transistors 201 share their source/drain region between the 2 (columns)×4 (rows) pixels 211-1 and 211-2.

Note that instead of the dummy transistors 201, another reset transistor for the 2 (columns)×4 (rows) pixels may be disposed, or nothing may be disposed. When nothing is disposed instead of the dummy transistors 201, the reset transistors 64 share their source/drain region between the 2 (columns)×4 (rows) pixels 211-1 and 211-2.

An A-A' cross-sectional view of FIG. 17 is the same as the A-A' cross-sectional view of FIG. 3, a B-B' cross-sectional view of FIG. 17 is the same as the B-B' cross-sectional view of FIG. 4, and a C-C' cross-sectional view of FIG. 17 is the same as the C-C' cross-sectional view of FIG. 5, and thus, description thereof is omitted.

Fifth Exemplary Configuration of Pixels

Figure 18:
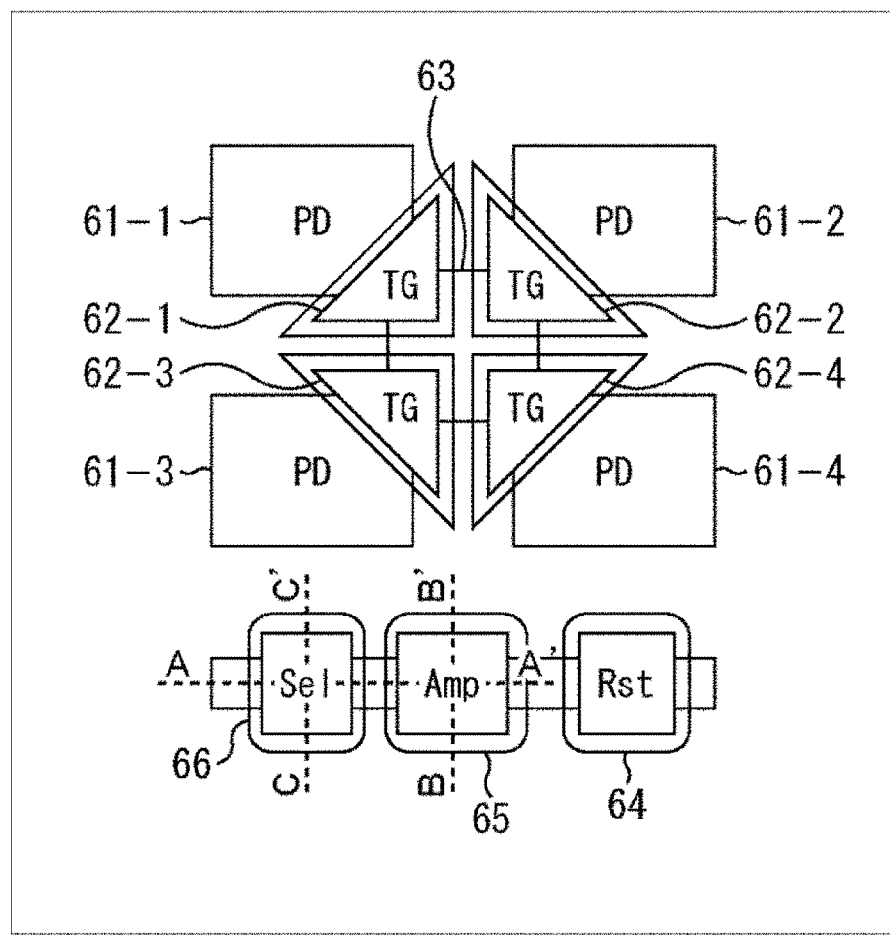
FIG. 18 is a top view showing a fifth exemplary configuration of 2×2 pixels.

FIG. 18 is a top view showing a fifth exemplary configuration of 2 (columns)×2 (rows) pixels arranged in the pixel region 11 of FIG. 1.

The configuration of FIG. 18 differs from the configuration of FIG. 2 in that an amplification transistor 65 and a reset transistor 64 share their source/drain region.

Specifically, for the 2 (columns)×2 (rows) pixels of FIG. 18, a selection transistor 66, the amplification transistor 65, and the reset transistor 64 are disposed in this order from the left in the drawing below PDs 61-3 and 61-4 in the drawing.

An A-A' cross-sectional view of FIG. 18 is the same as the A-A' cross-sectional view of FIG. 3, a B-B' cross-sectional view of FIG. 18 is the same as the B-B' cross-sectional view of FIG. 4, and a C-C' cross-sectional view of FIG. 18 is the same as the C-C' cross-sectional view of FIG. 5, and thus, description thereof is omitted.

Sixth Exemplary Configuration of Pixels

Figure 19:
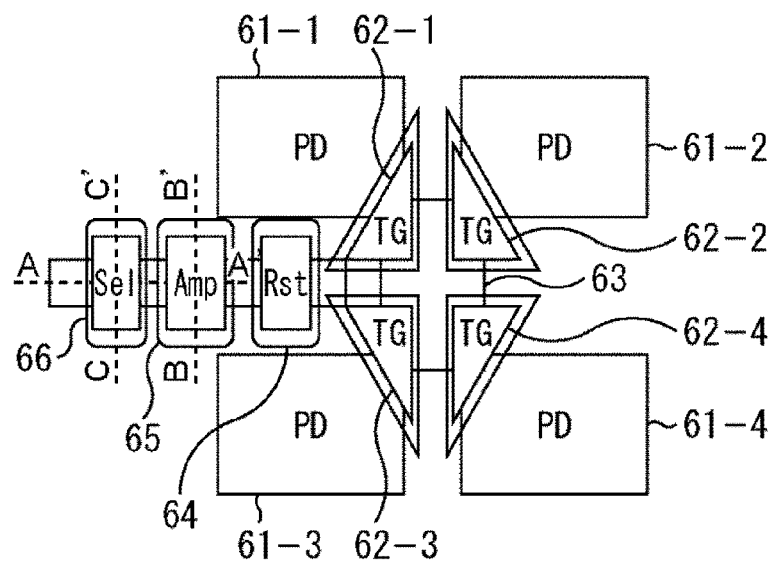
FIG. 19 is a top view showing a sixth exemplary configuration of 2×2 pixels.

FIG. 19 is a top view showing a sixth exemplary configuration of 2 (columns)×2 (rows) pixels arranged in the pixel region 11 of FIG. 1.

The configuration of FIG. 19 differs from the configuration of FIG. 18 in that a reset transistor 64 is disposed relatively close to an FD 63.

Specifically, for the 2 (columns)×2 (rows) pixels of FIG. 19, a selection transistor 66, an amplification transistor 65, and the reset transistor 64 are disposed in this order from the left in the drawing between a PD 61-1 and a PD 61-3.

An A-A' cross-sectional view of FIG. 19 is the same as the A-A' cross-sectional view of FIG. 3, a B-B' cross-sectional view of FIG. 19 is the same as the B-B' cross-sectional view of FIG. 4, and a C-C' cross-sectional view of FIG. 19 is the same as the C-C' cross-sectional view of FIG. 5, and thus, description thereof is omitted.

Seventh Exemplary Configuration of Pixels

Figure 20:
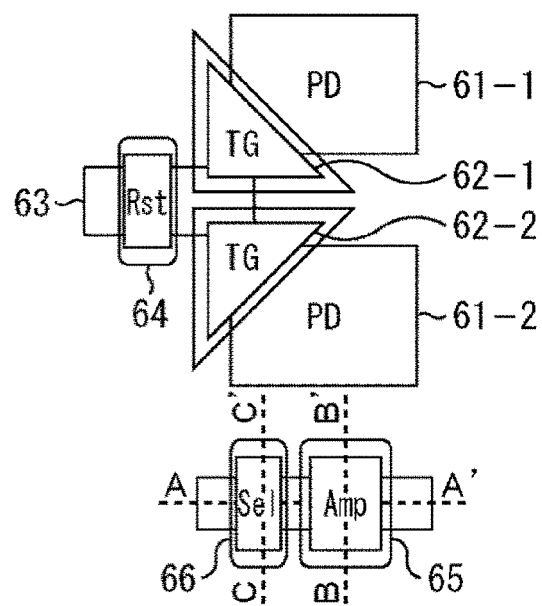
FIG. 20 is a top view showing a seventh exemplary configuration of 1×2 pixels.

FIG. 20 is a top view showing a seventh exemplary configuration of 1 (column)×2 (rows) pixels arranged in the pixel region 11 of FIG. 1.

The configuration of FIG. 20 differs from the configuration of FIG. 2 mainly in that a reset transistor 64, an amplification transistor 65, and a selection transistor 66 are shared by the 1 (column)×2 (rows) pixels.

Specifically, for the 1 (column)×2 (rows) pixels of FIG. 20, the selection transistor 66 and the amplification transistor 65 are disposed in this order from the left in the drawing below a PD 61-2 in the drawing. In addition, the reset transistor 64 is disposed between a PD 61-1 and the PD 61-2.

An A-A' cross-sectional view of FIG. 20 is the same as the A-A' cross-sectional view of FIG. 3, a B-B' cross-sectional view of FIG. 20 is the same as the B-B' cross-sectional view of FIG. 4, and a C-C' cross-sectional view of FIG. 20 is the same as the C-C' cross-sectional view of FIG. 5, and thus, description thereof is omitted.

Another Example of a Selection Transistor

Figure 21:
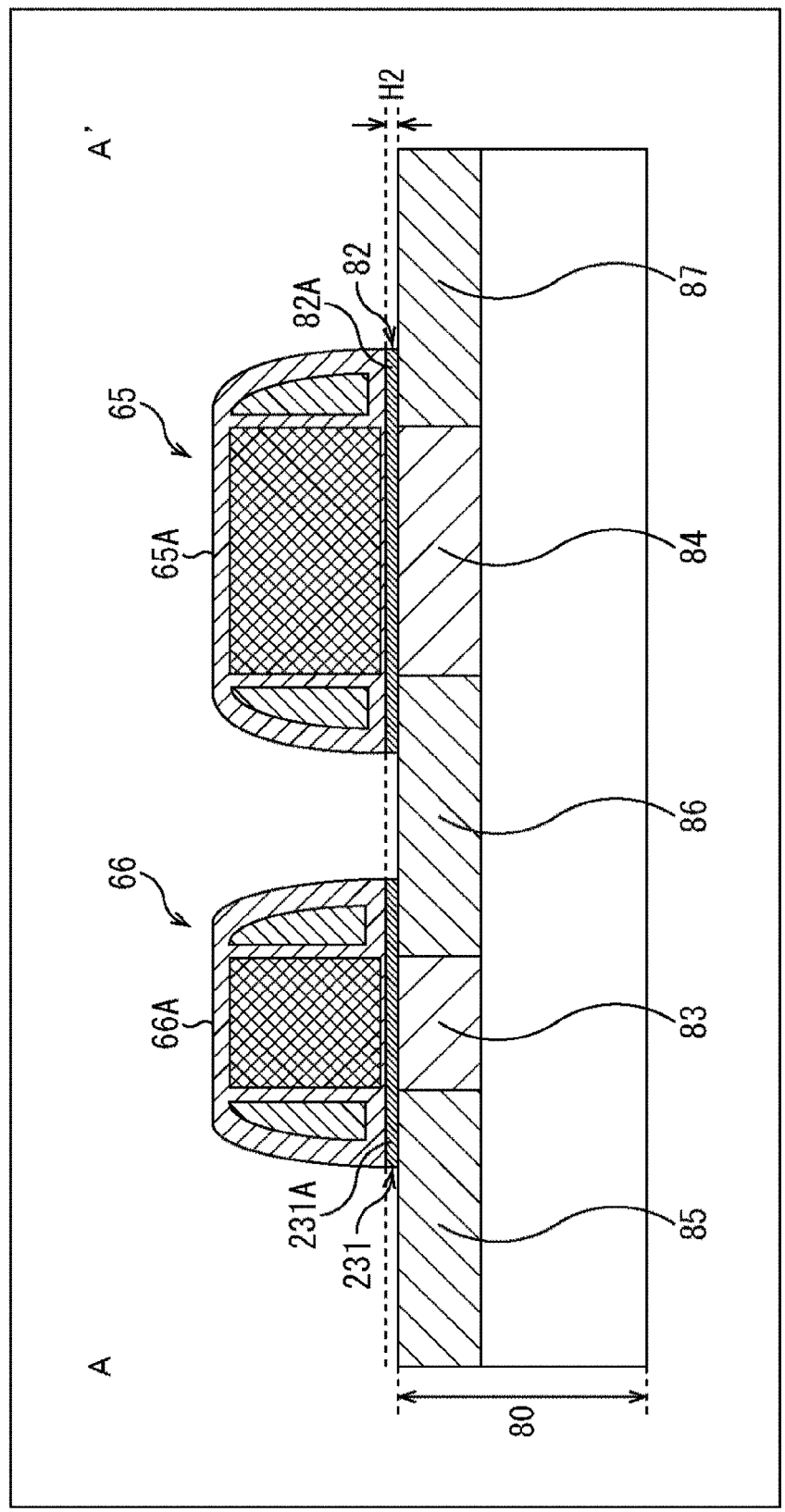
FIG. 21 is an A-A' cross-sectional view of FIG. 2 showing another example of a selection transistor.
Figure 22:
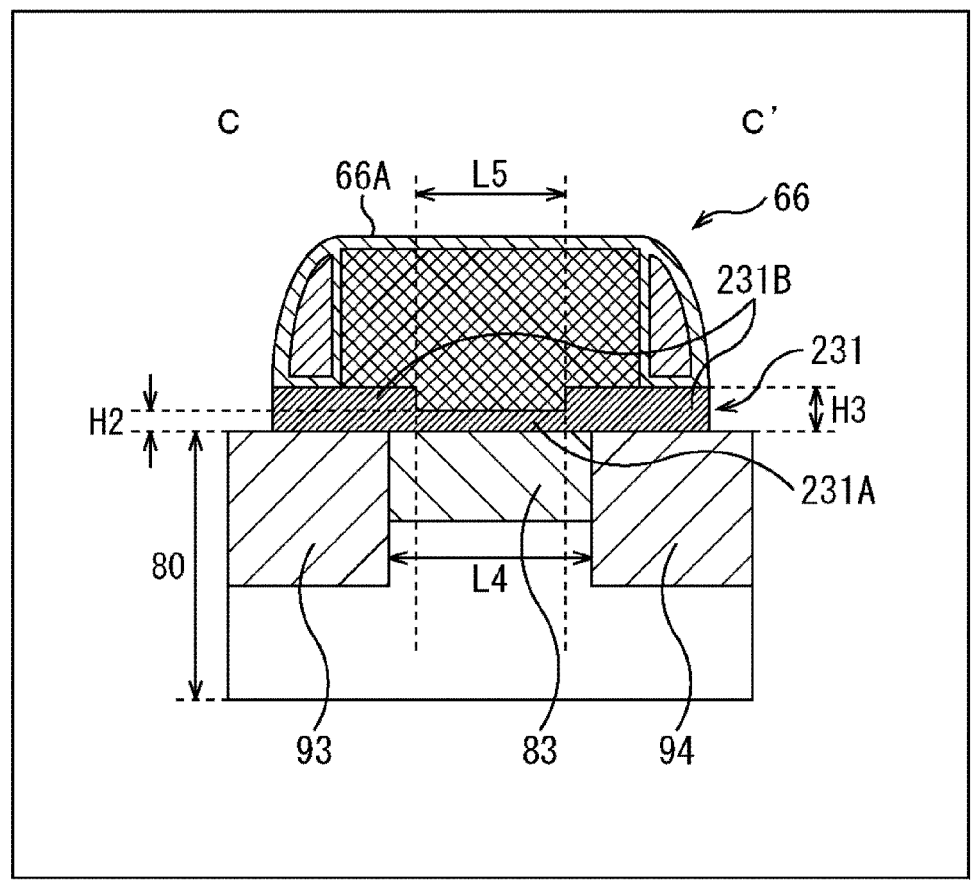
FIG. 22 is a C-C' cross-sectional view of FIG. 2 showing another example of the selection transistor.
Figure 23:
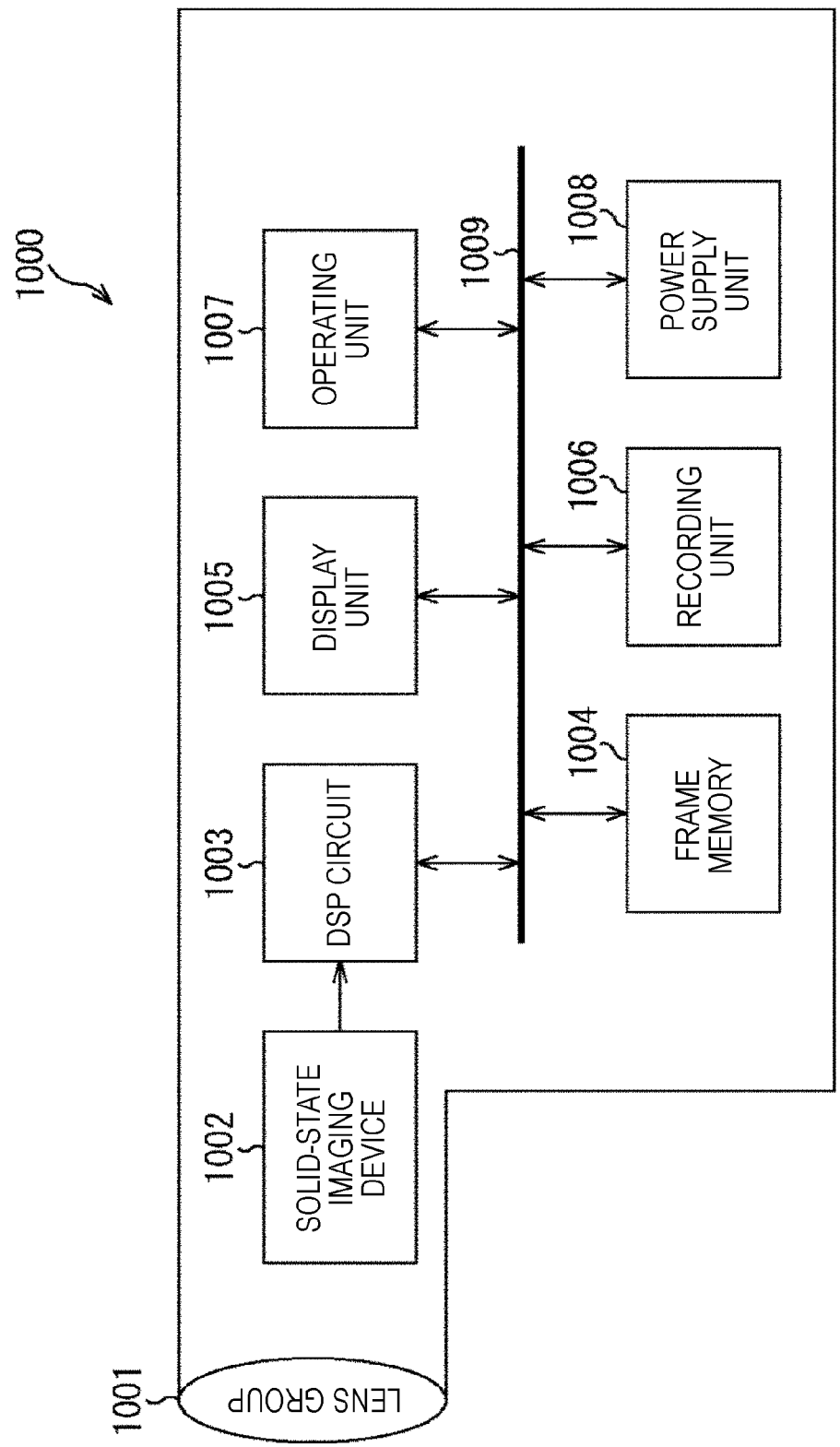
FIG. 23 is a block diagram showing an exemplary configuration of an imaging apparatus serving as an electronic device to which the present disclosure is applied.

FIG. 21 is an A-A' cross-sectional view of FIG. 2 showing another example of a selection transistor, and FIG. 22 is a C-C' cross-sectional view of FIG. 2 showing another example of the selection transistor.

Note that in FIGS. 21 and 22, the same portions as those in FIGS. 3 and 5 are denoted by the same reference signs, and description thereof is omitted as appropriate, as the description is repetitive.

In FIGS. 21 and 22, a gate insulating film 231 of the selection transistor 66 is configured in a similar manner to the gate insulating film 82 of the amplification transistor 65.

Specifically, instead of the gate insulating film 81, the gate insulating film 231 is formed below the gate electrode 66A of the selection transistor 66 on the semiconductor substrate 80. The film thickness H2 of a channel region insulating film 231A which is a central portion of the gate insulating film 231 above the channel region 83 is thin compared to the film thickness H1 of the gate insulating films of pixel transistors other than the amplification transistor 65 and the selection transistor 66 (the transfer transistors 62 and the reset transistor 64). In addition, the film thickness H3 of element separation region insulating films 231B, each including a portion of the gate insulating film 231 above a boundary between the channel region 83 and the element separation region 93, 94 and the whole portion of the gate insulating film 231 above the element separation region 93, 94, is thick compared to the film thickness H2. By this, the drive capability of the selection transistor 66 can be improved.

Note that it is also possible that the gate insulating films of two or more transistors selected from among the transfer transistors 62, the reset transistor 64, and the selection transistor 66 which are pixel transistors other than the amplification transistor 65, only the gate insulating films of the transfer transistors 62, and only the gate insulating film of the reset transistor 64 are configured in a similar manner to the gate insulating film 82. Namely, it is possible that the gate insulating films of some transistors selected from among the transfer transistors 62, the reset transistor 64, and the selection transistor 66 are configured in a similar manner to the gate insulating film 81, and the gate insulating films of other transistors are configured in a similar manner to the gate insulating film 82.

When only the gate insulating film of the reset transistor 64 is configured in a similar manner to the gate insulating film 82, the drive capability of the reset transistor 64 improves. In addition, when the gate insulating films of both the selection transistor 66 and the reset transistor 64 are configured in a similar manner to the gate insulating film 82, the drive capability of the selection transistor 66 and the reset transistor 64 improves.

In addition, when the gate insulating films of both the transfer transistors 62 and the reset transistor 64 are configured in a similar manner to the gate insulating film 82, the potential of the PDs 61 is easily modulated upon transfer operation and thus charge transfer can be easily performed.

Likewise, it is also possible that the gate insulating films of some transistors selected from among the transfer transistors 62, the reset transistor 64, and the selection transistor 66 are configured in a similar manner to the gate insulating film 82 (132 and 141), and the gate insulating films of other transistors are configured in a similar manner to the gate insulating film 111 (131 and 81).

Second Embodiment

Exemplary Configuration of One Embodiment of an Imaging Apparatus

FIG. 23 is a block diagram showing an exemplary configuration of an imaging apparatus serving as an electronic device to which the present disclosure is applied.

An imaging apparatus 1000 of FIG. 23 is a video camera, a digital still camera, or the like. The imaging apparatus 1000 includes a lens group 1001, a solid-state imaging device 1002, a DSP circuit 1003, a frame memory 1004, a display unit 1005, a recording unit 1006, an operating unit 1007, and a power supply unit 1008. The DSP circuit 1003, the frame memory 1004, the display unit 1005, the recording unit 1006, the operating unit 1007, and the power supply unit 1008 are connected to each other through a bus line 1009.

The lens group 1001 captures incident light (image light) from a subject and forms an image on an imaging plane of the solid-state imaging device 1002. The solid-state imaging device 1002 is composed of the above-described CMOS image sensor 10. The solid-state imaging device 1002 converts the amount of the incident light which is formed into an image on the imaging plane by the lens group 1001, into an electrical signal on a pixel-by-pixel basis and supplies the electrical signal as a pixel signal to the DSP circuit 1003.

The DSP circuit 1003 performs predetermined image processing on the pixel signals supplied from the solid-state imaging device 1002, and supplies an image signal having been subjected to the image processing to the frame memory 1004 on a frame-by-frame basis, and the image signal is temporarily stored in the frame memory 1004.

The display unit 1005 is composed of, for example, a panel type display apparatus such as a liquid crystal panel or an organic electro luminescence (EL) panel, and displays an image on the basis of the frame-by-frame pixel signals which are temporarily stored in the frame memory 1004.

The recording unit 1006 is composed of a digital versatile disk (DVD), a flash memory, or the like, and reads and records the frame-by-frame pixel signals which are temporarily stored in the frame memory 1004.

The operating unit 1007 issues operational instructions regarding various functions provided to the imaging apparatus 1000, under operations performed by a user. The power supply unit 1008 supplies power to the DSP circuit 1003, the frame memory 1004, the display unit 1005, the recording unit 1006, and the operating unit 1007, as appropriate.

Electronic devices to which the present technology is applied may be any apparatus that uses a CMOS image sensor as an image capturing unit (photoelectric conversion unit), and include, for example, a portable terminal apparatus having an imaging function and a copier that uses a CMOS image sensor as an image reading unit, in addition to the imaging apparatus 1000.

Note that the effects described in the present specification are merely exemplification and thus are not limited, and there may be other effects.

In addition, embodiments of the present disclosure are not limited to the above-described embodiments, and various changes may be made without departing from the true spirit of the present disclosure.

For example, when the structure of the pixels in the pixel region 11 is any of the structures of FIGS. 15 to 20, too, as shown in FIGS. 8 and 9, the element separation region insulating films and the gate insulating film of the selection transistor 66 may have the same thickness. In addition, as shown in FIGS. 10 to 12, the element separation region insulating films and the gate insulating film of the selection transistor 66 may be of the same type.

In addition, as shown in FIG. 13, the width in the W direction of the channel region insulating film may be wide compared to the channel width L0 of the amplification transistor 65, and may be narrow compared to the width (gate width) in the W direction of the gate electrode 65A. In addition, as shown in FIG. 14, a part of the element separation regions may be formed of an insulating film.

Note that the present disclosure can also employ the following configurations.

(1)

A solid-state imaging device including:

an amplification transistor having an element separation region formed by ion implantation; and a transistor, wherein a channel region insulating film is configured to be thin compared to a gate insulating film of the transistor, and an element separation region insulating film is configured to be thick compared to the channel region insulating film, the channel region insulating film being at least a part of a gate insulating film above a channel region of the amplification transistor, and the element separation region insulating film being at least a part of a gate insulating film above the element separation region of the amplification transistor.

(2)

The solid-state imaging device according to (1), wherein the element separation region insulating film and the gate insulating film of the transistor are configured to have a same film thickness.

(3)

The solid-state imaging device according to (1) or (2), wherein the element separation region insulating film and the gate insulating film of the transistor are configured to be of a same type.

(4)

The solid-state imaging device according to any of (1) to (3), wherein a width in a W direction of the channel region insulating film is configured to be narrow compared to a channel width of the amplification transistor.

(5)

The solid-state imaging device according to any of (1) to (3), wherein a width in a W direction of the channel region insulating film is configured to be wide compared to a channel width of the amplification transistor, and to be narrow compared to a gate width of the amplification transistor.

(6)

The solid-state imaging device according to any of (1) to (5), wherein a part of the element separation region is configured to be formed of an insulating film.

(7)

The solid-state imaging device according to any of (1) to (6), wherein the element separation region insulating film is configured to be formed by thermal oxidation.

(8)

The solid-state imaging device according to any of (1) to (7), wherein the amplification transistor is configured to be a depression type transistor.

(9)

The solid-state imaging device according to any of (1) to (8), further including a transistor other than the transistor that is selected from among a selection transistor, a reset transistor, and a transfer transistor, each of the selection transistor, the reset transistor, and the transfer transistor having an element separation region formed by ion implantation, wherein a channel region insulating film of the transistor other than the transistor is configured to be thin compared to the gate insulating film of the transistor, and an element separation region insulating film is configured to be thick compared to the channel region insulating film.

(10)

An electronic device including:

an amplification transistor having an element separation region formed by ion implantation; and a transistor, wherein a channel region insulating film is configured to be thin compared to a gate insulating film of the transistor, and an element separation region insulating film is configured to be thick compared to the channel region insulating film, the channel region insulating film being at least a part of a gate insulating film above a channel region of the amplification transistor, and the element separation region insulating film being at least a part of a gate insulating film above the element separation region of the amplification transistor.

REFERENCE SIGNS LIST

65 Amplification transistor
62-1 to 62-4 Transfer transistor
64 Reset transistor
66 Selection transistor
81 Gate insulating film
82A Channel region insulating film
82B Element separation region insulating film
84 Channel region
91 to 94 Element separation region
151A and 151B Insulating film
231A Channel region insulating film
231B Element separation region insulating film

What is claimed is:

1. A solid-state imaging device comprising:
a plurality of pixel units, wherein a first pixel unit comprises:
an amplification transistor formed on a semiconductor substrate, the amplification transistor comprising:
an element separation region formed by ion implantation;
a channel region;
a gate electrode; and
a first gate insulating film interposed between the gate electrode and the semiconductor substrate, wherein:
a first portion of the first gate insulating film is above the element separation region and under at least a portion of the gate electrode and comprises an element separation region insulating film, and
a second portion of the first gate insulating film is above the channel region and comprises a channel region insulating film; and
a pixel transistor comprising a second gate insulating film,
wherein the channel region insulating film is thinner than the second gate insulating film and the element separation region insulating film is thicker than the channel region insulating film.

2. The solid-state imaging device according to claim 1, wherein the element separation region insulating film and the second gate insulating film have a same thickness.

3. The solid-state imaging device according to claim 1, wherein the element separation region insulating film and the second gate insulating film are of a same type.

4. The solid-state imaging device according to claim 1, wherein a width of the channel region insulating film is less than a channel width of the amplification transistor.

5. The solid-state imaging device according to claim 1, wherein a width of the channel region insulating film is greater than a channel width of the amplification transistor and narrower than a gate width of the amplification transistor.

6. The solid-state imaging device according to claim 1, wherein a part of the element separation region is formed of an insulating film.

7. The solid-state imaging device according to claim 1, wherein the element separation region insulating film is formed by thermal oxidation.

8. The solid-state imaging device according to claim 1, wherein the amplification transistor is a depression type transistor.

9. The solid-state imaging device according to claim 1, further comprising a transistor other than the amplification transistor and the pixel transistor that is selected from among a selection transistor, a reset transistor, and a transfer transistor, wherein the transistor other than the amplification transistor and the pixel transistor comprises a second element separation region formed by ion implantation, a second channel region, a second element separation region insulating film, and a second channel region insulating film, wherein the second channel region insulating film is thinner than the second gate insulating film, and the second element separation region insulating film is thicker than the channel region insulating film.

10. An electronic device comprising:
a plurality of pixel units, wherein a first pixel unit comprises:
an amplification transistor formed on a semiconductor substrate, the amplification transistor comprising:
an element separation region formed by ion implantation;
a channel region;
a gate electrode; and
a first gate insulating film interposed between the gate electrode and the semiconductor substrate, wherein:
a first portion of the first gate insulating film is above the element separation region and under at least a portion of the gate electrode and comprises an element separation region insulating film, and a second portion of the first gate insulating film is above the channel region and comprises a channel region insulating film; and a pixel transistor comprising a second gate insulating film, wherein the channel region insulating film is thinner than the second gate insulating film and the element separation region insulating film is thicker than the channel region insulating film.

11. The electronic device according to claim 10, wherein the element separation region insulating film and the second gate insulating film have a same film thickness.

12. The electronic device according to claim 10, wherein the element separation region insulating film and the second gate insulating film are of a same type.

13. The electronic device according to claim 10, wherein a width of the channel region insulating film is less than a channel width of the amplification transistor.

14. The electronic device according to claim 10, wherein a width of the channel region insulating film is greater than a channel width of the amplification transistor and to be narrow compared to a gate width of the amplification transistor.

15. The electronic device according to claim 10, wherein a part of the element separation region is formed of an insulating film.

16. The electronic device according to claim 10, wherein the element separation region insulating film is formed by thermal oxidation.

17. The electronic device according to claim 10, wherein the amplification transistor is a depression type transistor.

18. The electronic device according to claim 10, further comprising a transistor other than the amplification transistor and the pixel transistor that is selected from among a selection transistor, a reset transistor, and a transfer transistor, wherein the transistor other than the amplification transistor and the pixel transistor comprises a second element separation region formed by ion implantation.

19. The electronic device according of claim 18, wherein the transistor other than the amplification transistor and the pixel transistor comprises a channel region insulating film thinner than the second gate insulating film.

20. The electronic device according to claim 19, wherein the transistor other than the amplification transistor and the pixel transistor comprises a second element separation region insulating film thicker than the channel region insulating film.

* * * * *